United States Patent [19]
Itagaki et al.

[11] Patent Number: 5,928,146
[45] Date of Patent: Jul. 27, 1999

[54] INSPECTION APPARATUS USING NUCLEAR MAGNETIC RESONANCE

[75] Inventors: Hiroyuki Itagaki, Kokubunji; Kenichi Okajima, Hachiouji; Tetsuhiko Takahashi, Souka; Kenji Takiguchi, Kashiwa, all of Japan

[73] Assignee: Hitachi Medical Corporation, Tokyo, Japan

[21] Appl. No.: 08/815,069

[22] Filed: Mar. 11, 1997

[30] Foreign Application Priority Data

Mar. 15, 1996 [JP] Japan .................................... 8-058755
Apr. 26, 1996 [JP] Japan .................................... 8-129315

[51] Int. Cl.$^6$ .................................................. A61B 5/055
[52] U.S. Cl. .......................... 600/410; 324/307; 324/309
[58] Field of Search .................................. 600/410, 413;
324/307, 309

[56] References Cited

U.S. PATENT DOCUMENTS 5,151,656  9/1992  Maier et al. .
5,621,321  4/1997  Liu et al. ................................. 324/309

FOREIGN PATENT DOCUMENTS 4-279148  10/1992  Japan .
5-68674    3/1993  Japan .
5-154130   6/1993  Japan .

OTHER PUBLICATIONS

X. Hu et al, "Reduction of Signal Fluctuation in Functional MRI Using Navigator Echoes", Magn. Reson. Med. 31, pp. 495–503, 1994.

J. Omiya et al, "Correlation Methods for MR Functional Imaging", Medical Imaging Technology, vol. 13, No. 4, Jul. 1995, pp. 583–584.

Primary Examiner—Marvin M. Lateef
Assistant Examiner—Eleni Mantis Mercader
Attorney, Agent, or Firm—Fay, Sharpe, Beall, Fagan, Minnich & McKee

[57] ABSTRACT

An inspection apparatus using nuclear magnetic resonance having arithmetic and control means for controlling a pulse sequence for detecting a nuclear magnetic resonance signal from a target to be inspected and calculating the detected signal. The arithmetic and control means controls an echo planar pulse sequence for acquiring a plurality of images of a predetermined same region of the target to be inspected; and arranges echo signal data obtained by measuring the inspection target by the echo planar pulse sequence and forms an EPI data set; designates a plurality of data points in k-space as observed points; designates a predetermined EPI data set to reference data for body motion for correcting influence by the body motion of the inspection target and calculates a reference phase as a phase of the body motion reference data at the observed points; calculates the phase of the EPI data set at the observed points; calculates a body motion correcting value expressing the influence by the body motion of the inspection target by using the phase difference between the phase of the EPI data set and the reference phase; and executes a process for eliminating the influence by the body motion of the inspection target by removing the phase difference of the EPI data set of the target to be inspected by using the body motion correction values.

25 Claims, 22 Drawing Sheets

LINEAR LINE AB : OBSERVED POINTS IN k SPACE FOR
DETERMINING PHASE PROFILE

PRIOR ART

INSPECTION APPARATUS USING NUCLEAR MAGNETIC RESONANCE

BACKGROUND OF THE INVENTION

The present invention relates to an inspection method and apparatus using nuclear magnetic resonance for measuring a nuclear magnetic resonance signal from hydrogen, phosphorus or the like in a subject to be inspected. More particularly, the invention relates to a nuclear magnetic resonance imaging (MRI) apparatus for visualizing a nuclear density distribution, a relaxation time distribution, or the like and a data processing method in brain function measurement using the MRI apparatus (hereinafter, referred to as a FMRI: Functional Magnetic Resonance Imaging). Further in detail, the invention relates to a body motion correcting method of correcting positional deviation of the brain caused by physiological factors such as respiration and cardiac pulsation with high accuracy.

A target of an MRI which is presently used in clinics is proton, a main substance of the subject to be inspected. A spatial distribution of the proton density and a spatial distribution of a relaxation phenomenon of nuclear spins from an exciting state are visualized and two- or three-dimensional images of the shapes or functions of the human head, abdomen, legs and arms, and the like are acquired. An echo planar sequence (EPI: Echo Planar Imaging) of which an example is shown in FIG. 1, is a typical high-speed sequence of the MRI apparatus. According to the EPI, after the nuclear spins are excited by applying a radio frequency magnetic field, a first gradient magnetic field is switched at high speed and a second gradient magnetic field is repeatedly applied, thereby measuring all of echo signals necessary for image reconstruction.

Generally, a procedure for obtaining the MRI signal is shown by using trajectories in a frequency space (k-space) shown in FIG. 2 by persons skilled in the art. In the k-space, the axis of the abscissa denotes a readout gradient magnetic field application amount and the axis of the ordinate shows a phase encoding amount. The coordinate in the k-space is expressed by (kx, ky) and the center of the space is (0, 0). The trajectories in the k-space corresponding to a pulse sequence of FIG. 1 are as shown in FIG. 2. Data obtained by sampling one echo signal is arranged as complex data (a detection signal itself) on a trajectory along the axis of the abscissa in the k-space in accordance with data acquisition order. A data column of one echo signal exactly corresponds to one lateral row of the trajectory. The trajectory is shifted in the direction of the axis of the ordinate each time a phase encoding pulse is applied. In a single shot EPI, the k-space is scanned in a one stroke writing manner. Consequently, an EPI data set is formed. After performing a known inverting process to the EPI data set and a process for correcting phase distortion of the nuclear spin caused by eddy currents, a two-dimensional FFT is executed, thereby reconstructing an MR image (Japanese Patent Application Laid-Open No. 5-68674). Generally, in the process for correcting the phase distortion caused by the eddy currents in the EPI, a pre-scan is performed and eddy current reference data for removing the phase distortion caused by the eddy currents is acquired. A method of removing the phase distortion caused by the eddy currents from the EPI data set by using the eddy current reference data is employed (Japanese Patent Application Laid-Open No. 5-68674).

In recent years, an FMRI (functional MRI) for extracting local activation of the brain by a slight signal change in a local part of time-series MR images has been being put into practical use. The FMRI is a measuring method of extracting the activity of the brain by using images acquired in time series. That is, while applying stimuli such as light and sound to a subject for a predetermined period, tens or hundreds time-series images are acquired. After that, a region (hereinlater, called an activated region) in which the signal intensity is increased synchronously with the stimuli is extracted from the time-series images and the signal change before and after the application of the stimuli is observed. Since the signal change is microscopic and occurs locally, it is important to use an imaging sequence in which the signal change is detected very sensitively. It is also necessary to consider body motion of the subject during the measuring period. In the FMRI, MRI images before the application of the stimuli are used as reference images and the activated region is visualized by removing the reference images from time-series images after the application of the stimuli. The body motion therefore causes an erroneous extraction of the activated region. Conventional techniques of 1) image acquiring method and 2) body motion correcting method which are used in the FMRI will be described hereinbelow.

1) Image acquiring method used in the FMRI

One of the time-series image acquiring methods used in the FMRI is an EPI which can obtain one image within 100 ms. FIG. 3 shows another example of a sequence in the EPI. In the EPI, after the nuclear spins are excited by applying a gradient magnetic field 102 for selecting a slice to be visualized and a radio frequency (RF) magnetic field 101, a signal readout gradient magnetic field Gx 106 is switched at high speed and a phase encoding gradient magnetic field Gy 104 is repeatedly applied, and all of the echo signals necessary to reconstruct an image are measured. Reference numeral 103 denotes a pulse for giving an offset of a phase encoding and 105 indicates a pulse for giving an offset of the readout gradient magnetic field. The gradient magnetic field Gx is called a signal readout gradient magnetic field, the gradient magnetic field Gy is called a phase encoding gradient magnetic field, and a gradient magnetic field Gz is called a slice selecting gradient magnetic field. The echo signal has information of the magnitude, frequency, and phase. The nuclear spins are modulated by the application of the gradient magnetic fields Gx and Gy and position information is given as frequency and phase. However, the frequency is actually detected as a phase difference. As shown in FIG. 4, the measured echo signals are arranged in the frequency space (k-space) and the EPI data set is formed. Shown in FIG. 4 are a spatial frequency kx in the x direction; a spatial frequency ky in the y direction; and circles indicative of A/D sampling points. A distance between neighboring sampling points in the axis of abscissa kx corresponds to an application amount (time integral value of the magnitude of the magnetic field) of the signal readout gradient magnetic field Gx 106 which is applied during one sampling period. A distance between neighboring sampling points in the ky axis direction corresponds to an application amount (time integral value of the magnitude of the magnetic field) of the phase encoding gradient magnetic field Gy 104. The EPI data set is subjected to a 2-dimensional Fourier transformation, thereby reconstructing the image.

Although the EPI is an imaging method having an excellent time resolution, it also has a drawback such that the phase of the echo signal is disturbed by the eddy currents occurring by a high-speed switching of the strong signal readout gradient magnetic field Gx 106 and the quality of the reconstructed image is deteriorated. For solving this drawback, a method in which the phase of the EPI data set is corrected by performing a pre-scan in order to remove the phase disturbance of the echo signal caused by the eddy currents and measuring reference data for eddy current is disclosed in Japanese Patent Application Laid-Open No. 5-68674.

The eddy current reference data is measured without applying the phase encoding gradient magnetic fields Gy 103 and 104 in FIG. 3. An example of the correcting procedure is shown in FIG. 5. First, the reference data for the eddy current is gathered (step 21). A one-dimensional Fourier transformation in the kx direction is applied to the reference data for the eddy current (step 22). The phase variation in the kx direction after the Fourier transformation is calculated (step 23). The sign of the calculation result is inverted and the resultant data is memorized as a correction value (step 24). The processes from step 22 to step 24 are performed with respect to all of the columns in the k-space (step 25). Subsequently, the EPI data set is gathered (step 26). The 1-dimensional Fourier transformation in the kx direction is applied to the EPI data set (step 27). The phase variation in the kx direction after the Fourier transformation is calculated (step 28). The correction value obtained from the calculation in step 24 is added to the phase every corresponding column, thereby correcting the phase (step 29). The corrected data is 1-dimensional Fourier transformed in the ky direction (step 30), thereby reconstructing the image. With the above steps, the disturbance of the phase of the echo signal caused by the eddy currents is removed, so that the high quality of the EPI image can be achieved.

2) Body motion correcting method

There are, broadly speaking, two kinds of body motion which cause problems in the FMRI. The first body motion is motion of the whole head. The occurrence of the first body motion can be prevented by strongly fixing the head. Otherwise, a method of correcting the body motion by a signal process is disclosed in Japanese Patent Application Laid-Open No. 5-154130. According to the method, echo signals (hereinlater, called navigator echoes) for detecting the body motion are generated, and the body motion is detected and the correction value is derived. The second body motion relates to movement of the brain due to the change in the pressure in the cranium by respiration and cardiac pulsation. Since the second body motion is caused by physiological factors, the occurrence of it cannot be prevented. It is therefore necessary to reduce the influence by the body motion by a signal process. An example of correcting the second body motion by using the navigator echoes has been reported (Magn. Reson. Med. 31, 495–503 (1994)), in which a correction effect of reduction of signal fluctuations in the activated region is confirmed. In the FMRI, it is pointed out that slight motion of the target to be inspected becomes a problem when the signals are analyzed and a method of correcting the positional deviation between images due to the motion by a post process is disclosed (by Jun Omiya et al, "Correlation image process for MR function image", Medical Imaging Technology, Vol. 13, No. 4, pp. 583–584, July 1995). According to the method, the positional deviation between two images is detected and corrected by using information near the origin of the k-space.

SUMMARY OF THE INVENTION

Although a conventional body motion correcting method using the navigator echoes is widely used in ordinary imaging sequences or high-speed imaging sequences, there are the following problems when the method is applied to the EPI. The problems are shown hereinbelow. In the case of the ordinary or high-speed image acquisition, as shown in FIG. 6A, one echo signal is corrected by a correction value calculated from one nagivator echo. Meanwhile, in case of the EPI, all of the echo signals are corrected by the correction value obtained from one navigator echo (FIG. 6B). That is, a conventional algorithm for correction cannot be applied and the method cannot cope with a case in which influences by the body motion are different depending on the echo signals. Even if the correction is performed on the assumption that the influences by the body motion are the same depending on the echo signals, there are the following problems. According to the EPI, as shown in FIG. 3, all of the echo signals necessary to reconstruct the image are acquired by one excitation of the nuclear spins. The magnitude M of the echo signal is expressed by an expression $M=M0 \cdot EXP\{-t/T\}$ where t denotes time elapsed since the application of RF, T shows relaxation time, and Mo shows the magnitude of the echo signal at t=0. The SN ratio of the echo signal deteriorates as the time elapses. In the case where the navigator echoes are acquired before the echo signals for image reconstruction, the start time of measuring the echo signals for image formation becomes late and there is the possibility that the image quality is deteriorated. On the contrary, when the navigator echoes are acquired after measuring all of the echo signals for image reconstruction, since the signals having a low SN ratio are used for the body motion correction, it is difficult to obtain sufficient precision of the correction. For the above reasons, the body motion is not sufficiently corrected with respect to time series data of the FMRI obtained in the EPI and a high-precise body motion correcting method has been requested.

The first object of the invention is to correct the body motion with high accuracy without generating the navigator echoes.

According to examinations by the inventors, there is a case that the inspection target is seen slightly moving due to fluctuations in characteristics of the apparatus not only by motions of organisms but also even when images of an inspection target inherently supposed to have no motion (for example, an organism equivalent phantom) are acquired. Such motion is seen especially in the phase encoding direction. The size of the motion is approximately from 0.5 to 1.0 pixel. Although such peculiar motion can be corrected by performing the conventional motion correction, a simple phase shift correcting algorithm using a simpler index is requested for a high-speed process in the MRI apparatus. However, the algorithm is not optimized for such peculiar fluctuation in the characteristics of the apparatus in the conventional technique. Also, minute examinations from the viewpoint of application to the MRI apparatus have not been reported and a phase deviation correcting method which is more suitable to be applied to the MRI apparatus has been requested.

The second object of the invention is to provide a novel method of correcting, in a real time manner, a phase shift or distortion due to fluctuations in characteristics of the apparatus occurring with the elapse of time during the acquisition of images without generating navigator echoes and to provide an MRI apparatus by which precise images of the FMRI can be acquired.

In order to achieve the first object, reference data for correcting influences by the body motion (hereinafter, called body motion reference data) is used in the invention. The body motion reference data is gathered by the same EPI pulse sequence as that in the acquisition of the time-series images of the target to be inspected. One of EPI data sets (sets of data in which the echo signals for reconstructed image are arranged in the k-space) gathered by the acquisition of the time-series images is designated and used as body motion reference data. A correction value for correcting the influence by the body motion is calculated from the phase difference between the body motion reference data and each of the EPI data sets which form the time-series images. According to the invention, the correction value can be calculated every echo signal, so that a highly precise body correction can be realized.

The features of the invention will be described in detail hereinbelow. According to the invention, there is provided an inspection apparatus using nuclear magnetic resonance, comprising: a static magnetic field generating means for generating static magnetic field; gradient magnetic field generating means for generating gradient magnetic fields in three directions; radio frequency magnetic field generating means for generating a radio frequency magnetic field for exciting nuclear magnetization of a target to be inspected; detection means for detecting a nuclear magnetic resonance signal from the target to be inspected; and arithmetic and control means for calculating a detection signal of the signal detection means, exciting the nuclear magnetization in a predetermined cross section of the target to be inspected and controlling a pulse sequence for detecting the nuclear magnetic resonance signal, wherein the arithmetic and control means:

(a1) controls an EPI pulse sequence for acquiring a plurality of images of a predetermined same region of the target to be inspected;

(b1) (1) arranges echo signal data obtained by measuring the inspection target by the EPI pulse sequence in a frequency space (hereinlater, called a k-space) and forms an EPI data set for each image;

(2) selects and designates a plurality of data points (sampling points) in the k-space as observed points which are used to observe phase profiles for detecting the body motion of the target to be inspected;

(3) designates a predetermined one of the EPI data sets to body motion reference data for correcting influence by the body motion of the inspection target, arranges it in the k-space, and calculates a reference phase of the body motion reference data at the observed points (hereinlater, called a reference phase);

(4) calculates a phase of the EPI data set at the observed points;

(5) calculates a body motion correcting value expressing the influence by the body motion of the inspection target by using the phase difference between the phase of the EPI data set and the reference phase; and (6) executes a process for removing the influence by the body motion of the inspection target by eliminating the phase difference of the EPI data set of the inspection target by using the body motion correction value.

It is characterized in that the arithmetic and control means:

(a2) controls an EPI pulse sequence for acquiring a plurality of images of a predetermined same region of the target to be inspected;

(b2) (1) calculates a value for correction phase distortion caused when the EPI pulse sequence is implemented from an echo signal obtained by measuring the target to be inspected at least in a part of the EPI pulse sequence;

(2) arranges echo signals obtained by measuring the target to be inspected by the EPI pulse sequence in a frequency phase space (hereinlater, called a k-space) and forms an EPI data set corresponding to each image;

(3) selects and designates a plurality of data points (sampling points) in the k-space as observed points which are used to observe phase profiles for detecting the body motion of the target to be inspected;

(4) designates a predetermined one of the EPI data sets to body motion reference data for correcting influence by the body motion of the target to be inspected and calculates a phase (hereinlater, called a reference phase) of the body motion reference data at the observed points;

(5) calculates a phase of the EPI data set at the observed point;

(6) calculates a body motion correction value expressing the influence by the body motion of the inspection target by using the phase difference between the phase of the EPI data set and the reference phase;

(7) removes the influence by the body motion of the target to be inspected by removing the phase difference of the EPI data set by using the body motion correction values; and (8) executes a process for operating a reconstruction of the image by using the EPI data set in which the influence by the body motion of the target to be inspected is removed.

Further, in an inspection apparatus using nuclear magnetic resonance having the above features, (a) the observed points are arranged in parallel with one of the coordinate axes in the k-space or arranged in parallel with coordinate axes of two or more coordinate axes selected from the coordinate axes in the k-space or arranged in parallel to one of orthogonal coordinate axes set in the k-space or arranged in parallel to two or more orthogonal coordinate axes set in the k-space;

(b) the body motion reference data is acquired synchronously with respiration of the target to be inspected, or in a state where the target to be inspected stops, holds his/her breath, or synchronously with electrocardiogram of the target to be inspected;

(c) processes for calculating the phase difference between the phase of the EPI data set and the reference phase at every corresponding observed point and for deriving the body motion correction value at each observed point from the phase difference at every observation point and the coordinate values in the k-space are included;

(d) processes for calculating the phase difference between the phase of the EPI data set and the reference phase at every corresponding observed point and for obtaining approximate linear lines from the phase difference at every observation point and the coordinate values in the k-space by a least-square method are included;

(e) processes for calculating the phase difference between the phase of the EPI data set and the reference phase at every corresponding observed point and for obtaining approximate linear lines from the phase difference at every observed point and the coordinate value in the k-space by a least-square method, and also a process for deriving a body motion correction value at each coordinate value from the approximate linear lines and the coordinate values in the k-space are included;

(f) in the above (d) or (e), the approximate linear lines are obtained by designating data points (sampling points) having a high signal intensity in the EPI data set to the observed points;

(g) either a process for removing the phase difference at each coordinate value in the k-space calculated from the approximate linear lines obtained in either (d), (e), or (f)

from the EPI data set of the target to be inspected, or a process for inverting the sign of the phase difference between the phase value of the EPI data set and the reference phase and using it as the body motion correction value is included;

(h) an operation for removing an inclination of the approximate linear lines obtained in either (d), (e), or (f) from the EPI data set of the target to be inspected is included;

(i) an operation for removing offset components and an inclination of the approximate linear lines obtained in either (d), (e), or (f) and the phase difference, from the EPI data set of the target to be inspected is included;

(j) the body motion correction is performed after a value for correcting phase distortion caused by eddy currents is derived; and the like.

The first method of correcting the body motion for the EPI data set without generating navigator echoes of the invention will be summarized as follows with reference to FIG. 11.

Data points (sampling points) to calculate the phase in the ky direction are determined in the k-space (step 1). The reference data for body motion is gathered by the pulse sequence (EPI pulse sequence) which is the same as that obtained by the EPI data set (step 2) and the phase (reference phase) is calculated and stored (steps 3 and 4). The EPI data set is gathered (step 5) and its phase is calculated (step 6). Phase of the EPI data set—reference phase is calculated (step 7), and an approximate linear line is calculated (step 8). By using the approximate linear line, the value of the phase difference at each of ky coordinate points is obtained (step 9), the EPI data set is corrected by a value obtained by inverting the sign of the phase difference is used as a correction value (step 10). The processes from step 5 to step 10 are executed to each EPI data set. The sign of the phase difference derived in step 7 can be also inverted and used as a correction value.

Consequently, a different correction value is derived every echo signal, so that the body motion can be corrected with high accuracy. A case of correcting the body motion in the xy plane can be also coped with by expanding the algorithm.

In order to achieve the second object, according to the invention, there is provided an inspection apparatus using nuclear magnetic resonance, comprising: radio frequency pulse generating means for irradiating a radio frequency pulse to a target to be inspected to apply transverse magnetization to nuclear spins in the target to be inspected; phase encoding gradient magnetic field pulse generating means for applying a phase encoding gradient magnetic field pulse a plurality of times in a first direction at predetermined time intervals to the nuclear spins to which the transverse magnetization is applied while changing the encoding amount; readout gradient magnetic field pulse generating means for applying a readout gradient magnetic field pulse in which the polarity is alternately periodically inverted in a second direction, together with the phase encoding gradient magnetic field pulse which is applied a plurality of times, to the nuclear spins to which the phase encoding gradient magnetic field pulse is applied; echo detecting means for detecting echo signals in a time series manner, which are generated in each period during which the readout gradient magnetic field pulses are applied; and image reconstructing means for reconstructing an image of a slice of the target to be inspected from the echo signals detected, and the apparatus for performing phase correction in the first and second directions of the echo signals for reconstructing an image of the target to be inspected by using the echo signals detected without applying the phase encoding gradient magnetic pulse in the first direction, wherein when a plurality of images are acquired by continuously gathering images of the same region of the target to be inspected, the image reconstructing means: estimates a phase rotation amount of the echo signal per unit time from a phase of the echo signal in which a phase encoding amount by the phase encoding gradient magnetic field pulse is zero among the echo signals which correspond to the plurality of images and are phase corrected in the first and second directions and a time when the echo signal in which the phase encoding amount is zero since applying the radio frequency pulse is acquired; detects variation in the phase rotation amount among the plurality of images from the estimated phase rotation amount; determines a phase correction amount of each echo signal in which the phase encoding amount is zero or non-zero; and corrects the phase of each of the echo signals.

The second method of correcting a positional deviation or distortion of an image by correcting phase errors occurring in image data of a target to be inspected due to fluctuations in characteristics of the apparatus with the elapse of time during the image acquisition in a dynamic scan using the singleshot EPI without using the navigator echoes of the invention is summarized as follows.

When a number of images are acquired by continuously gathering images of the same region of the target to be inspected in order to reconstruct the image, a phase rotation amount of the echo signal per unit time is estimated from a phase of a signal in which a phase encoding amount by a phase encoding gradient magnetic field pulse is zero among the signals corresponding to each image and a time when a signal in which the phase encoding amount is zero and the radio frequency pulse is acquired; fluctuation of the phase rotation amount between the images is detected from the estimated phase rotation amount; and a phase correction amount of each echo signal in which the phase encoding amount is zero or non-zero is determined; and the phase of each echo signal is corrected.

Consequently, when the target is inspected in such a manner that the images of the target to be inspected are continuously acquired by the MRI apparatus in a manner similar to the FMRI and a data process is performed to the plurality of images acquired, the phase errors occurring in the image data due to the variation in the characteristics of the apparatus with the elapse of the operating time of the apparatus can be corrected. Thus, an accurate image of the FMRI can be acquired.

DESCRIPTION OF THE PREFERRED EMBODIMENTS

Figure 7A:
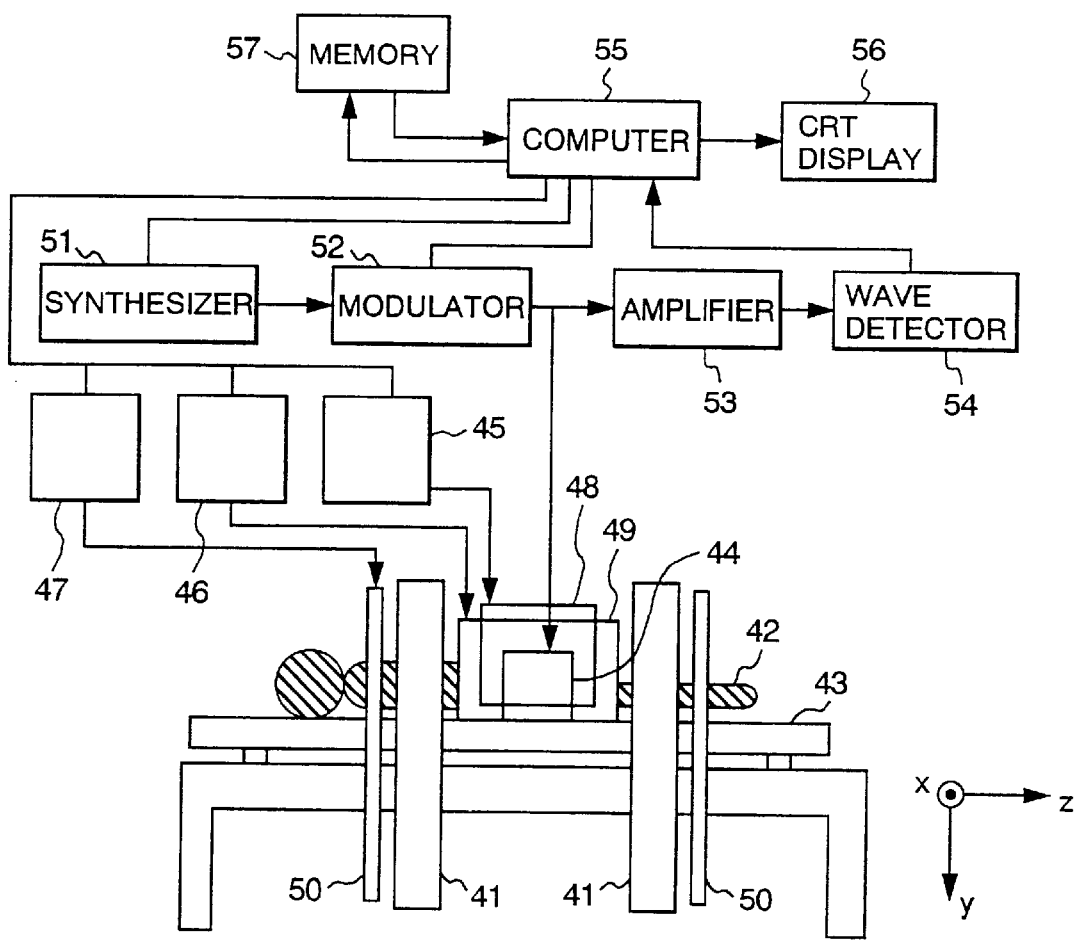
FIGS. 7A and 7B are diagrams showing first and second structures of an MRI apparatus to which the invention is applied.

A first structure of an MRI apparatus to which the invention is applied is shown in FIG. 7A. In the apparatus shown in FIG. 7A, the direction of the static magnetic field is in parallel with the axis of a human body. Reference numeral 41 denotes a magnet 41 for producing the static magnetic field; 42 an object to be inspected; 43 a bed on which the object 42 to be inspected is laid; 44 a radio frequency magnetic field coil for producing a radio frequency magnetic field and also detecting an echo signal generated from the object 42 to be inspected; 48, 49, and 50 gradient magnetic field coils for producing x-, y-, and z-direction gradient magnetic fields, respectively; 45, 46, and 47 coil drivers for supplying currents to the gradient magnetic field coils 48, 49, and 50, respectively; 55 a computer for processing measured data and reconstructing an image; and 56 a CRT display for displaying the image reconstructed by the computer 55. The outline of the operation of the apparatus will be described. The waveform of the radio frequency generated by a synthesizer 51 is shaped and its power is amplified by a modulator 52 and the current is supplied to the radio frequency magnetic field coil 44, thereby producing the radio frequency magnetic field for exciting the nuclear magnetization of the object 42 to be inspected. The echo signal generated from the object 42 to be inspected is received by the radio frequency magnetic field coil 44, amplified by an amplifier 53 and detected by a wave detector 54. After that, the signal is inputted to the computer 55 and is stored in a memory 57. Data being calculated and final results are stored in the memory 57. The computer 55 reconstructs the image and displays the result on the CRT display 56. The computer 55 controls the synthesizer 51, the coil drivers 45, 46, 47 for supplying the current to the gradient magnetic field coils 48, 49, 50, and other units in the MRI apparatus to control a predetermined pulse sequence. In place of the computer 55, an arithmetic and control processing apparatus (means) for controlling units in the MRI apparatus and executing operations can be also used.

Figure 7B:
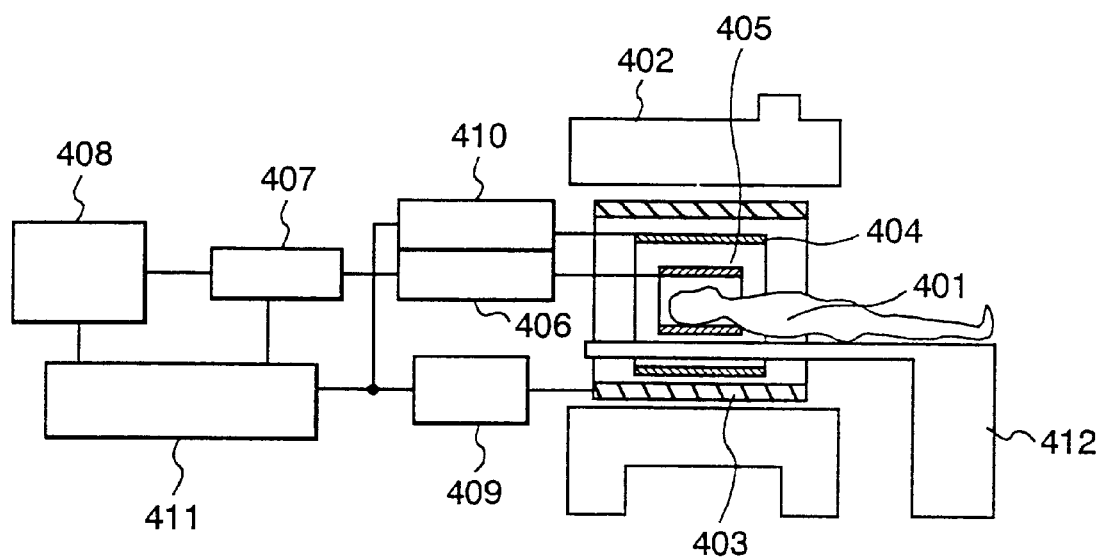

A second structure of the MRI apparatus to which the invention is applied is shown in FIG. 7B. In the apparatus shown in FIG. 7B, the direction of the static magnetic field is in parallel with the axis of the human body. Reference numeral 401 denotes an object to be inspected. The head is laid in a measurement space for inspection. Reference numeral 402 indicates a magnet system for producing the static magnetic field, which produces a uniform static magnetic field in a predetermined space region. As the magnet system 402 for producing the static magnetic field, various systems each using a superconducting magnet, a resistive magnet, or a permanent magnet as a magnetic field producing source can be also used. Reference numeral 403 denotes a gradient magnetic field coil for superimposing a gradient magnetic field on the static magnetic field in the measurement space in which the object 401 to be inspected is measured and for producing the gradient magnetic field in three directions which perpendicularly cross each other in the measurement space. Reference numeral 404 indicates an RF coil for irradiating electromagnetic waves to the inspection object 401 laid in the measurement space; 405 an RF receiving coil for detecting signals generated from nuclear spins in the inspection target which are nuclear magnetic resonated by the electromagnetic waves from the RF coil 404; 406 a signal detection unit for amplifying, detecting, and A/D converting the signal detected by the RF receiving coil 405; 407 a signal processing unit for performing various processes and calculation by using a signal from the signal detection unit 406, thereby forming image data; 408 an image display unit having a CRT or the like for displaying the image data formed by the signal processing unit 407; 409 a driver for the gradient magnetic field for supplying electricity to the gradient magnetic field coil 403; 410 an RF transmitting unit for generating a signal corresponding to the electromagnetic wave to be irradiated from the RF coil 404 to the inspection target 401; 411 a controller for systematically controlling the gradient magnetic field driver 409, RF transmitting unit 410, signal detection unit 406, signal processing unit 410, and the like and also controlling the execution of a pulse sequence for detecting the signal from the inspection target 401; and 412 a bed for supporting the inspection target 401 and moving an inspection region of the inspection target 401 to the measurement space. In the apparatus shown in FIG. 7B, the control unit for controlling the respective units in the MRI apparatus and the processing unit are separately provided.

First, an embodiment of the invention regarding the first method and apparatus for correcting body motion with high precision without producing navigation echoes will be described in detail with reference to the drawings. In the invention, the body motion is detected and corrected by using body motion reference data and the phase of an EPI data set. As mentioned above, the body motion reference data is acquired by the same pulse sequence as that in acquisition of time-series images. Therefore, one of a series of EPI data sets gathered by the acquisition of the time series images can be allocated as the body motion reference data. It is preferable to acquire the body motion reference data when the subject holds his/her breath in order to reduce an influence by the body motion.

Figure 8:
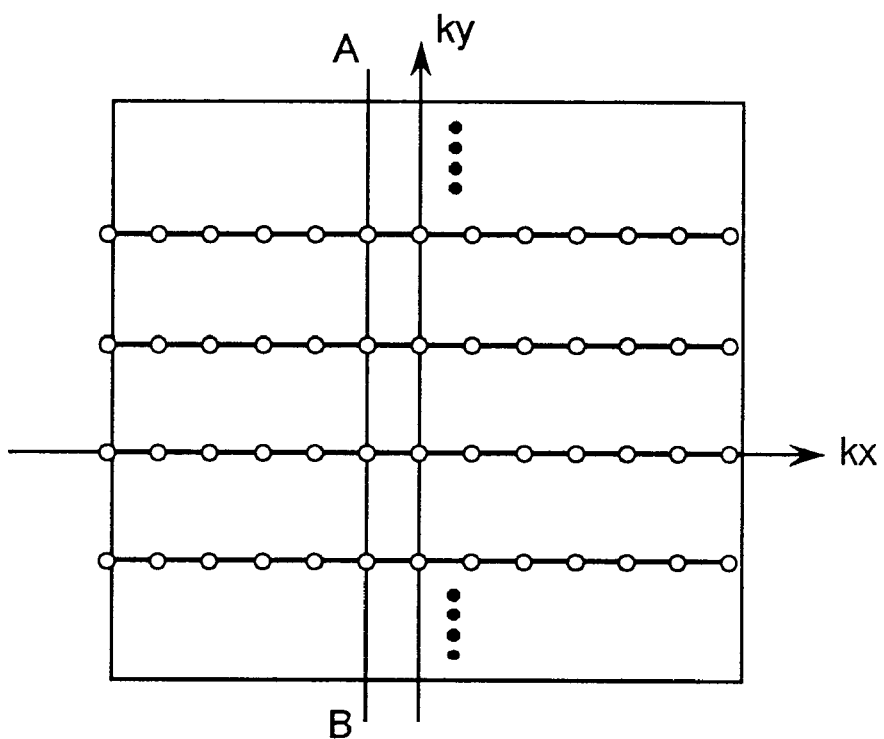
FIG. 8 is a diagram showing an example of points in the k-space for determining a phase profile which is used for body motion detection of the invention.

A method of designating data to be used in detection of the body motion will be described. FIG. 8 is a diagram of a k-space of the reference data for body motion and the EPI data set. The body motion is detected by using data points of sampling points on a linear line AB. Although the linear line AB can be set in an arbitrary position in the k-space as long as it coincides with or is in parallel with the ky axis, it is preferable to be set in a region where a signal intensity is high. When the linear line AB is in parallel to the ky axis as shown in FIG. 8, the body motion in the y direction is corrected. In order to correct the body motion in the x direction, a linear line CD (not shown in FIG. 8) is provided in parallel with the kx axis and the body motion is detected by using data points on the linear line as observed points. The body motion in the z direction can be similarly corrected. By combining the body motion corrections, for example, in both of the x and y directions, the body motion in the xy plane can be also corrected. The reason will be described hereinafter. According to the invention, since the body motion is detected and corrected by using the same algorithm with respect to all of the directions, an example in which data points on the linear line AB are used as shown in FIG. 8 will be described hereinbelow.

A description of a method of detecting the body motion will be given now. In order to explain the principle of the correcting method, a phase change when a point p in a measurement space (x, y, z) is moved from p1(px, py) to p2(px, py+dpy) is obtained. In a pulse sequence shown in FIG. 3, a phase modulation occurring at the point p1 by applying gradient magnetic fields Gx and Gy is θ1 shown in the expression (1) and a phase modulation occurring at the point p2 is θ2 shown in the expression (2).

$$\theta 1=\gamma \int (G1 \cdot px+G2 \cdot py)dt \qquad (1)$$

$$\theta 2=\gamma \int \{G1 \cdot px+G2 \cdot (py+dpy)\}dt \qquad (2)$$

where, γ is a gyromagnetic ratio (constant), G1 and G2 are amplitudes of the gradient magnetic fields Gx and Gy, and t is time. The difference dθ of the phase modulation of the point p by the movement from the point p1 to the point p2 is obtained by the following expression (3).

$$d\theta=\theta 2-\theta 1=\gamma \int (G2 \cdot dpy)dt \qquad (3)$$

Figure 3:
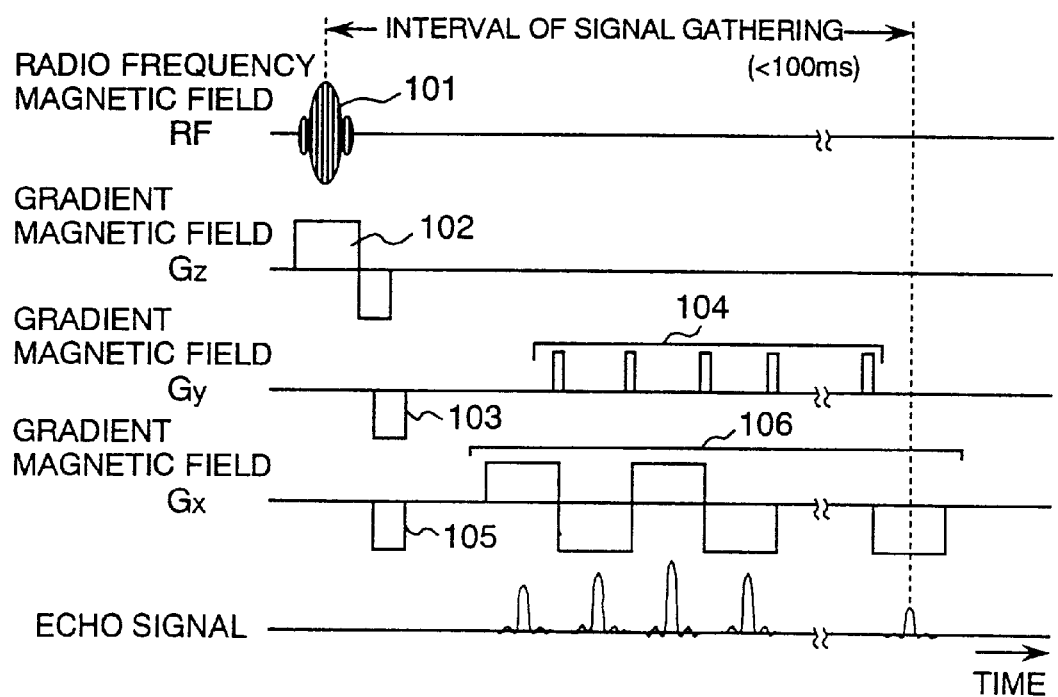
FIG. 3 shows an example of a pulse sequence of a conventional EPI to which the invention is applied.
Figure 4:
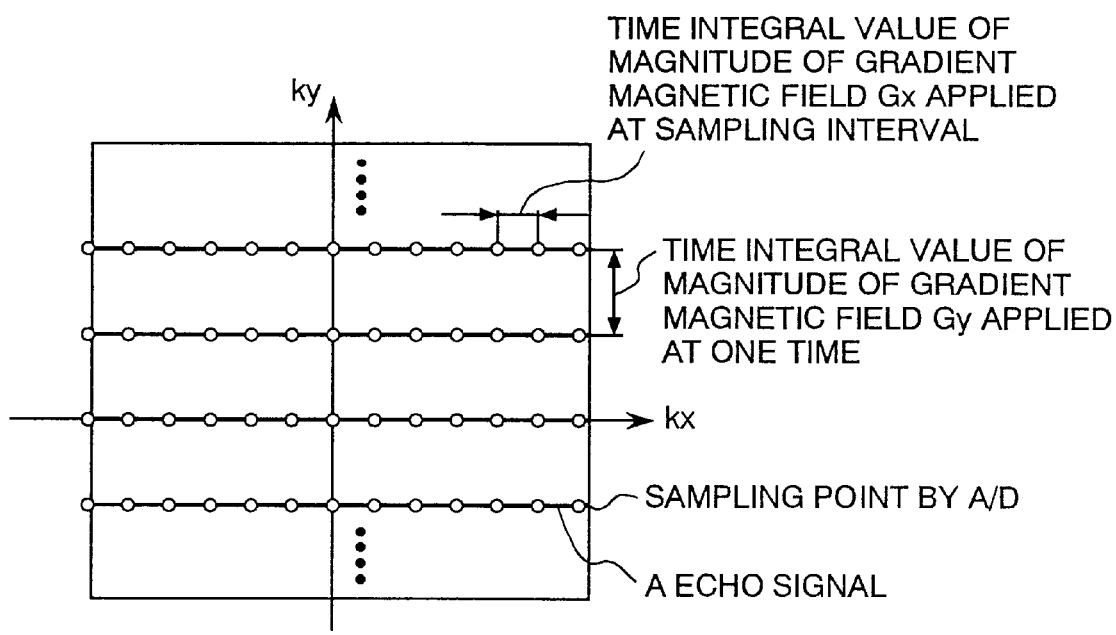
FIG. 4 is a diagram showing an example in which echo signals by the pulse sequence of the EPI shown in FIG. 3 are arranged in the k-space.

Since the gradient magnetic field in the y direction is discretely applied as shown in FIG. 3, the expression (3) can be modified as the following expression (4).

$$d\theta=\gamma \cdot G2 \cdot dpy \cdot n \cdot T \qquad (4)$$

where, T denotes time per application of a phase encoding gradient magnetic field 104 applied in a rectangular shape and n denotes a number of the echo signal. It is found from the expression (4) that a phase difference dθ is proportional to the order of generation of the echo signals and a proportional constant reflects a movement amount. That is, the body motion can be detected by the inclination of a phase profile in the linear line AB which is in parallel to the ky axis shown in FIG. 8. The body motion in the y direction has been described above. The body motion in the xy plane will be described next. When the expression (4) is replaced by an expression showing a phase distribution in the k-space, a phase difference θpky of body motion reference data at a point (0, pky) is expressed by the following expression (5).

$$\theta pky=\theta 0+\alpha y \cdot pky \qquad (5)$$

where, θ0 denotes a phase offset at the origin and αy denotes a inclination of the phase difference in the ky direction. Similarly, a phase difference θpkx of the body motion reference data at a point (pkx, 0) is expressed by the following expression (6).

$$\theta pkx=\theta 0+\alpha x \cdot pkx \qquad (6)$$

where, αx denotes a slope of the phase difference in the kx direction. From the expressions (5) and (6), the phase difference θ from the reference data for body motion at a point pk(pkx, pky) in the k-space can be calculated and expressed by the following expression (7).

$$\theta=\theta 0+\alpha x \cdot pkx+\alpha y \cdot pky \qquad (7)$$

A map θ(kx, ky) of the phase difference on the (kx, ky) plane is formed as mentioned above. Consequently, the body motion in the xy plane can be corrected.

Figure 9A:
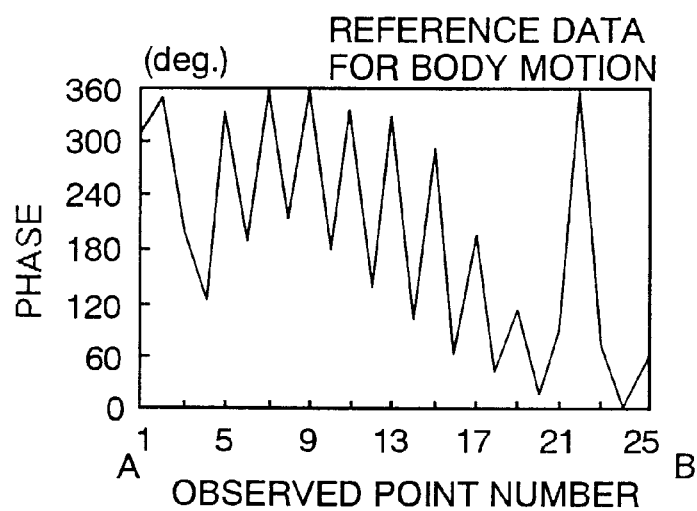
FIGS. 9A, 9B, and 9C are diagrams showing phase profiles of reference data for body motion, an EPI data set 1, and an EPI data set 2 to which the invention is applied, respectively.
Figure 9B:
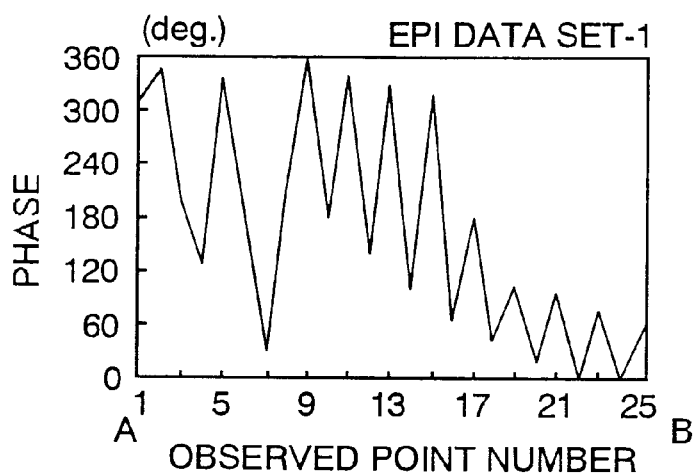
Figure 9C:
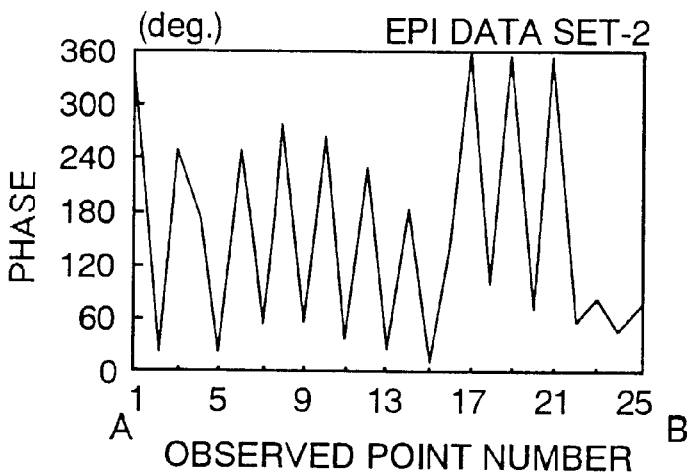
Figure 10:
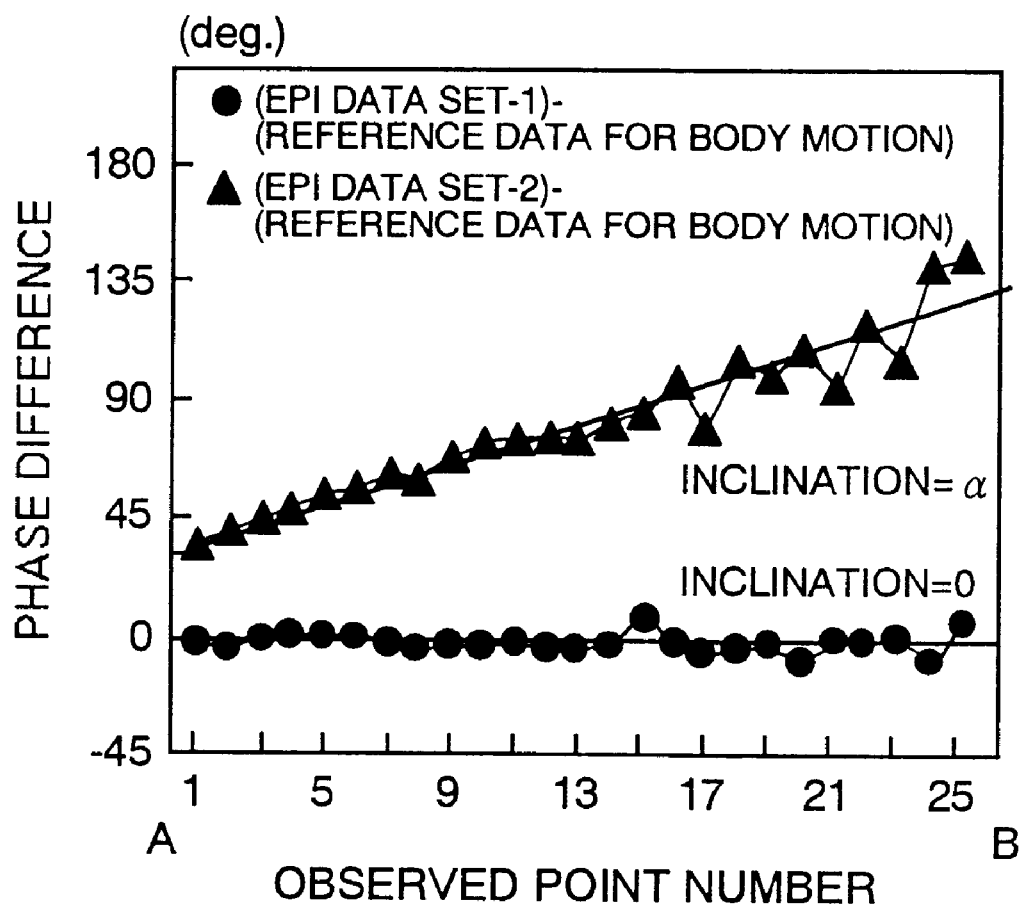
FIG. 10 is a diagram showing examples of a phase difference between the body motion reference data and the two EPI data sets gathered by applying the invention.

A specific example using actual data will be shown. It is assumed that the body motion is only in the y direction. FIGS. 9A, 9B, and 9C are phase profiles of the body motion reference data and the EPI data sets, in which only regions where signal intensities are high are shown. In FIGS. 9A, 9B, and 9C, numbers shown at each axis of abscissa of each graph denote numbers of the echo signals. Number 1 denotes an A side shown in FIG. 8 and 25 denotes a B side shown in FIG. 8. FIG. 9A shows the phase profile of the body motion reference data. FIG. 9B shows the phase profile of an EPI data set without body motion (hereinafter, referred to as an EPI data set 1). FIG. 9C shows the phase profile of an EPI data set with body motion (hereinafter, referred to as an EPI data set 2). The body motion is detected from a difference in phases between the body motion reference data and the EPI data set. FIG. 10 is a graph showing phase differences between the two EPI data sets and the body motion reference data, respectively. When linear line approximation is executed by using a least-square method or the like, it is found that the inclination of the graph of (EPI data set 1)—(body motion reference data) is almost zero. On the contrary, the graph of (EPI data set 2)—(body motion reference data) has a inclination α. As mentioned above, the inclination of the graph reflects the degree of the positional deviation. The body motion can be corrected by eliminating the inclination α.

Figure 11:
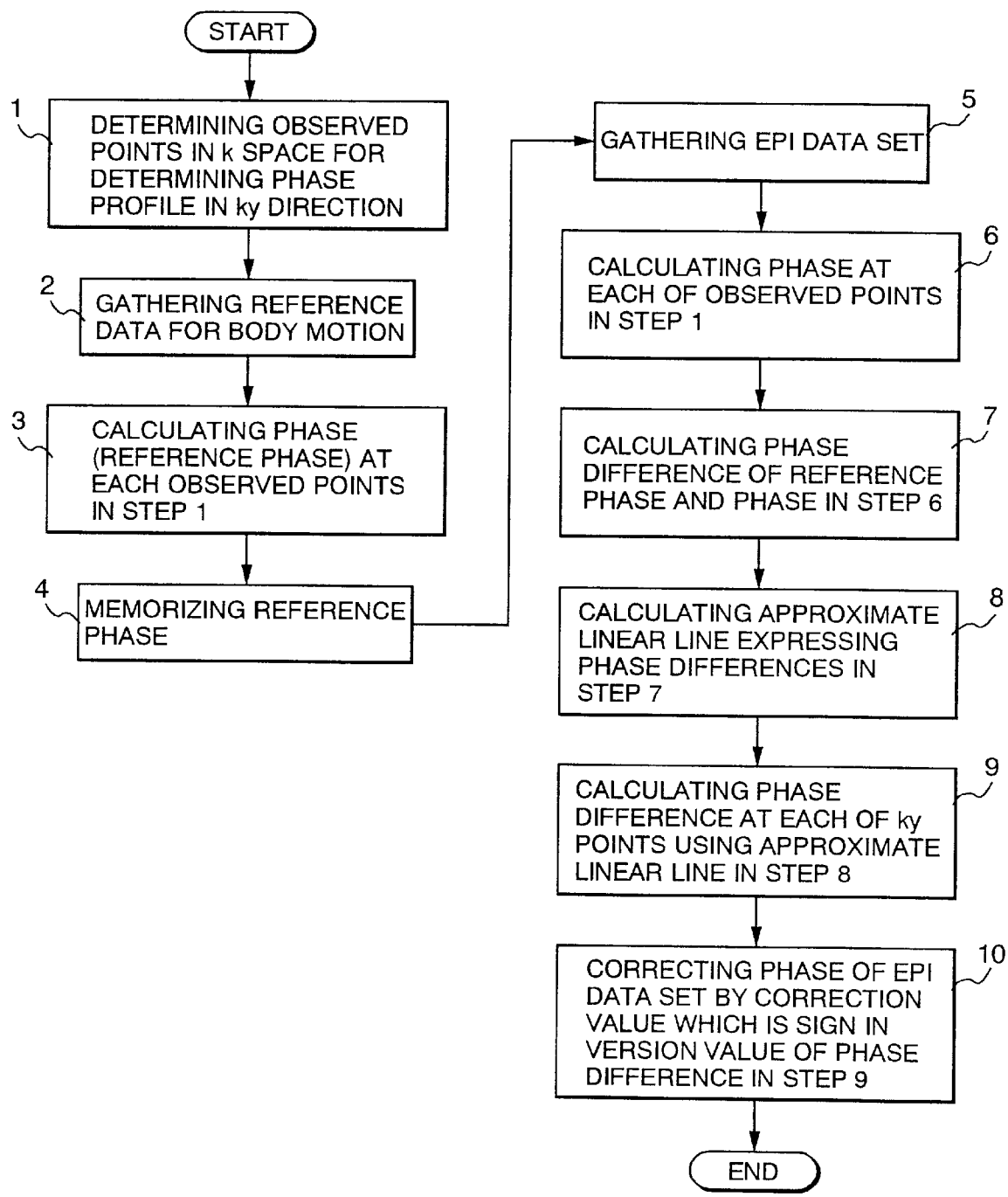
FIG. 11 is a flowchart showing an example of a data processing procedure regarding the body motion is correction of the invention.
Figure 12:
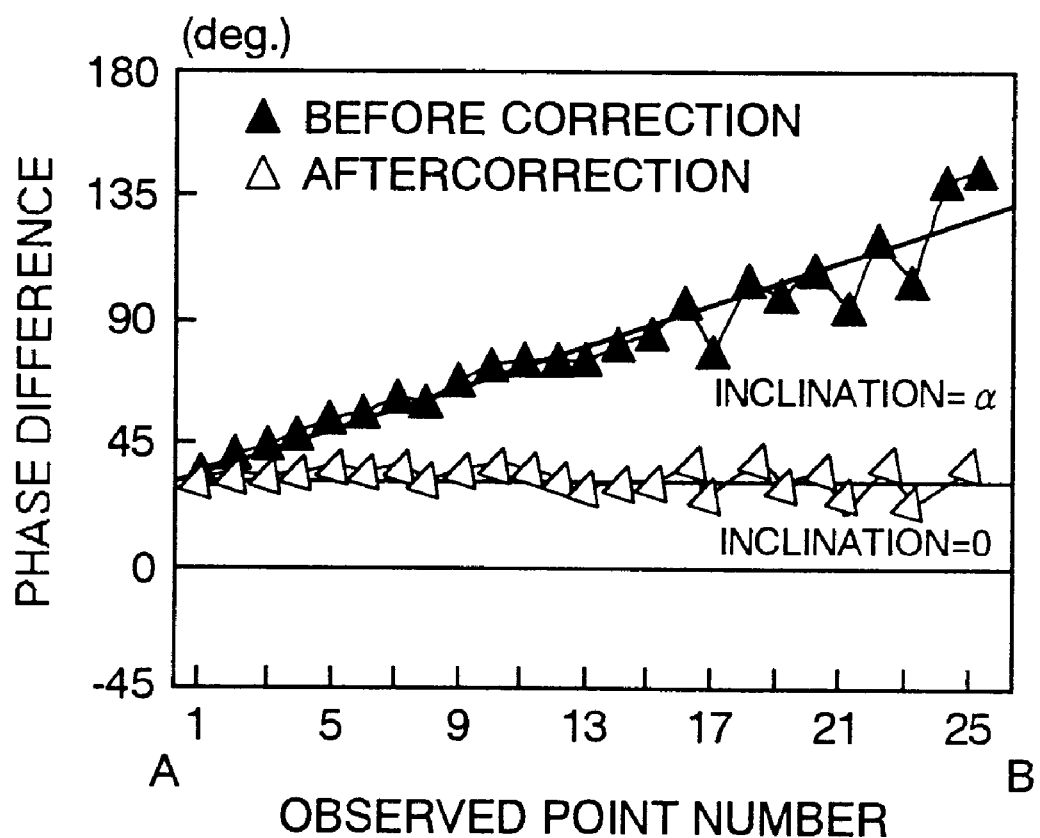
FIG. 12 is a diagram showing an example of the result of the correction according to the invention by removing a inclination α by using the data shown in FIG. 10.

A method of correcting the body motion will be described hereinbelow. FIG. 11 shows an example of a procedure of a data process regarding the body motion correction. Step 1 has been already described by an example with reference to FIG. 8. The reference data for body motion in step 2 is acquired by the same pulse sequence as that of the EPI data set. Consequently, any one of the EPI data sets can be allocated to the body motion reference data. After that, the phase of the body motion reference data is calculated (step 3), and the resultant reference phase is memorized (step 4). Subsequently, the EPI data set is gathered (step 5) and the phase of it is calculated (step 6). A difference between the phase calculated in step 6 and the reference phase, that is, {(the phase of the EPI data set)—(reference phase)} is calculated (step 7). The least-square method is applied to the result of the calculation, thereby calculating the approximate linear line (step 8). The phase difference at each ky point is obtained by using the approximate linear line calculated in step 8 (step 9). The EPI data set is corrected by using a correction value which is a sign inversion value of the phase difference in step 9 (step 10). FIG. 12 shows the result of the correction of the body motion by eliminating the inclination α by using the data shown in FIG. 10. The inclination α after the correction is almost zero.

Since the correction values are different for the respective EPI data sets, the processes from step 6 to step 10 have to be performed every EPI data set. It is not always necessary to use the least-square method to gather the correction value but it is also possible to use a value obtained by inverting the sign of the phase difference gathered in step 7 as a correction value. It is also possible that an approximate linear line is formed by using only a region in which the signal intensity is high and a correction value of a region in which the signal intensity is low is derived by using the approximate linear line.

Figure 13:
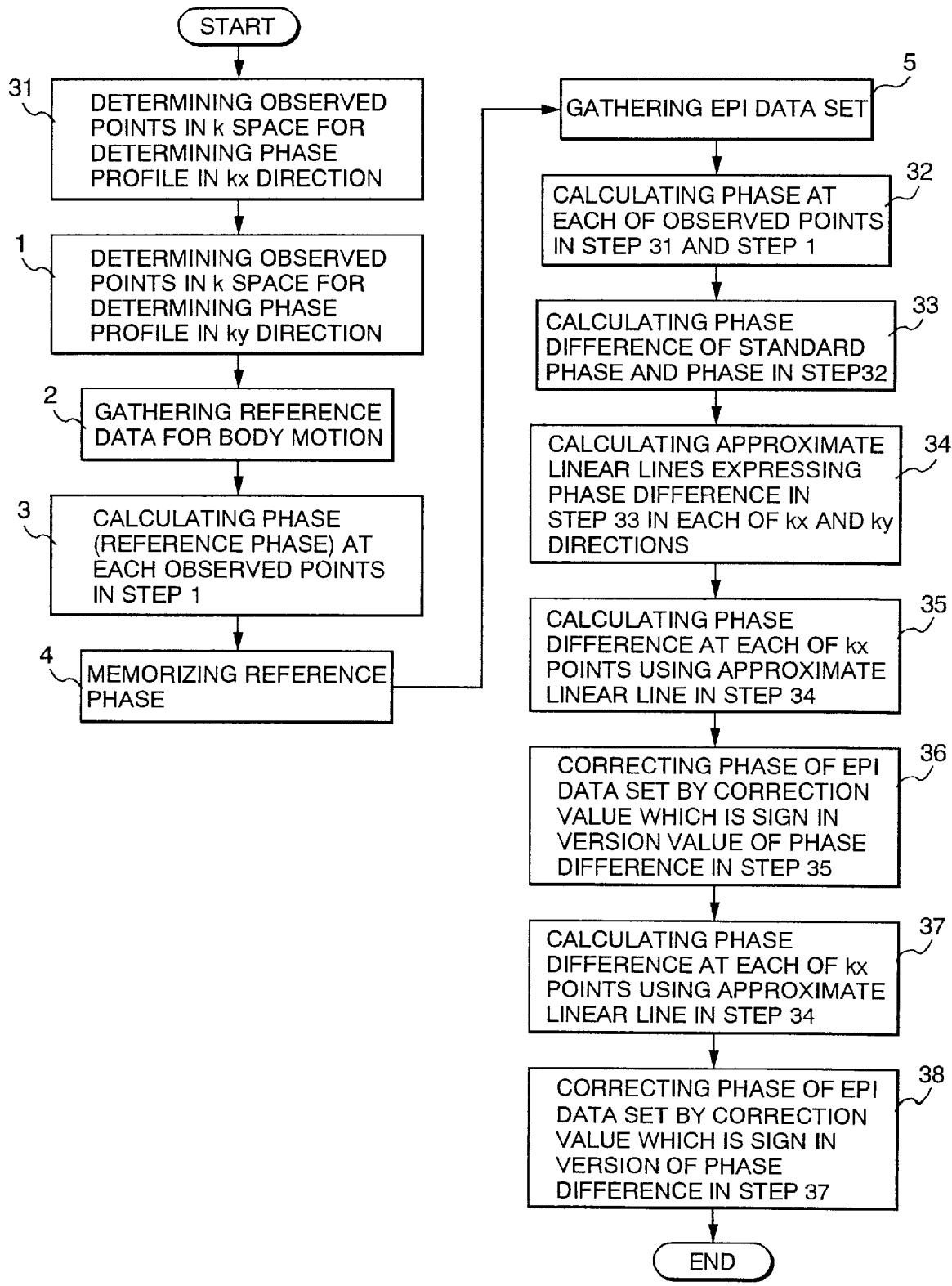
FIG. 13 is a flowchart showing a procedure for correcting the body motion in both of the xy directions for correcting the body motion in the xy plane of the invention.

Although the above description relates to the case where the body motion in the y direction is corrected, as shown in FIG. 13, by extending the algorithm shown in FIG. 11, the invention can cope with a case of correcting a body motion in the xy plane (that is, a case of correcting the body motion in the x and y directions). First, observed points for obtaining a phase profile in the kx direction is determined from the data points in the k-space (step 31) and the processes from step 1 to step 5 in FIG. 11 are executed. A phase at each observed point determined in steps 31 and 1 is obtained (step 32) and the phase difference between the phase and the reference phase is calculated (step 33). The least-square method is applied to the phase differences in the kx and ky directions gathered in step 33, thereby calculating the approximate linear line (step 34). By using the approximate linear line, the phase difference at each kx point is calculated (step 35). A value which is a sign inversion value of the phase difference in the kx direction obtained in step 35 is used as a correction value and the phase of the EPI data set is corrected with the correction value (step 36). The phase difference at each ky point is calculated by using the approximate linear line obtained in step 34 (step 37). A value which is a sign inversion value of the phase difference in the kx direction obtained in step 37 is used as a correction value and the phase of the EPI data set is corrected with the correction value (step 38).

Figure 14:
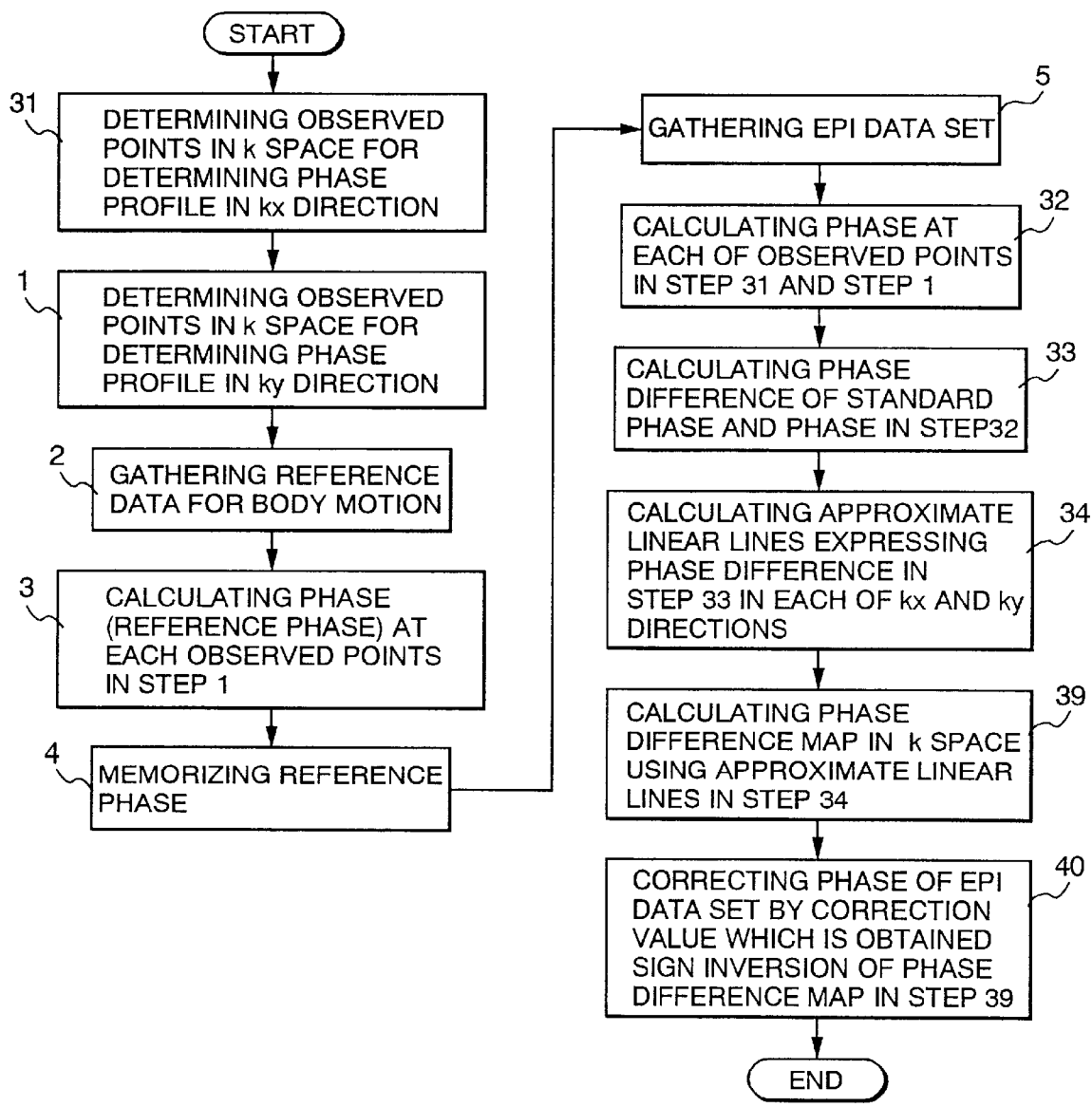
FIG. 14 is a flowchart showing a procedure for correcting the body motion in both of the xy directions for correcting the body motion in the xy plane of the invention.

Alternatively, as shown in FIG. 14, the phase difference can be eliminated by using a map θ(kx, ky) of the phase difference at each point in the k-space obtained by the expression (7). In FIG. 14, the processes from step 31 to step 5 and from step 32 to 34 are the same as those described in FIG. 13. The phase difference at each point in the k-space, that is, the map θ(kx, ky) by the expression (7) is calculated by using the approximate linear lines (step 39). A value obtained by inverting the sign of the phase difference at each point in the k-space derived in step 39 is used as a correction value and the phase of the EPI data set is corrected with the correction value (step 40). A two-dimensional Fourier transformation in the kx and ky directions is performed to the corrected EPI data set obtained in step 38 in FIG. 13 or in step 40 in FIG. 14, thereby acquiring an image.

According to the invention as mentioned above, when there is body motion, the correction value different for every echo signal is derived. The body motion can be corrected more precisely than a method of correcting all of echo signals by one signal by using the navigation echoes.

Figure 5:
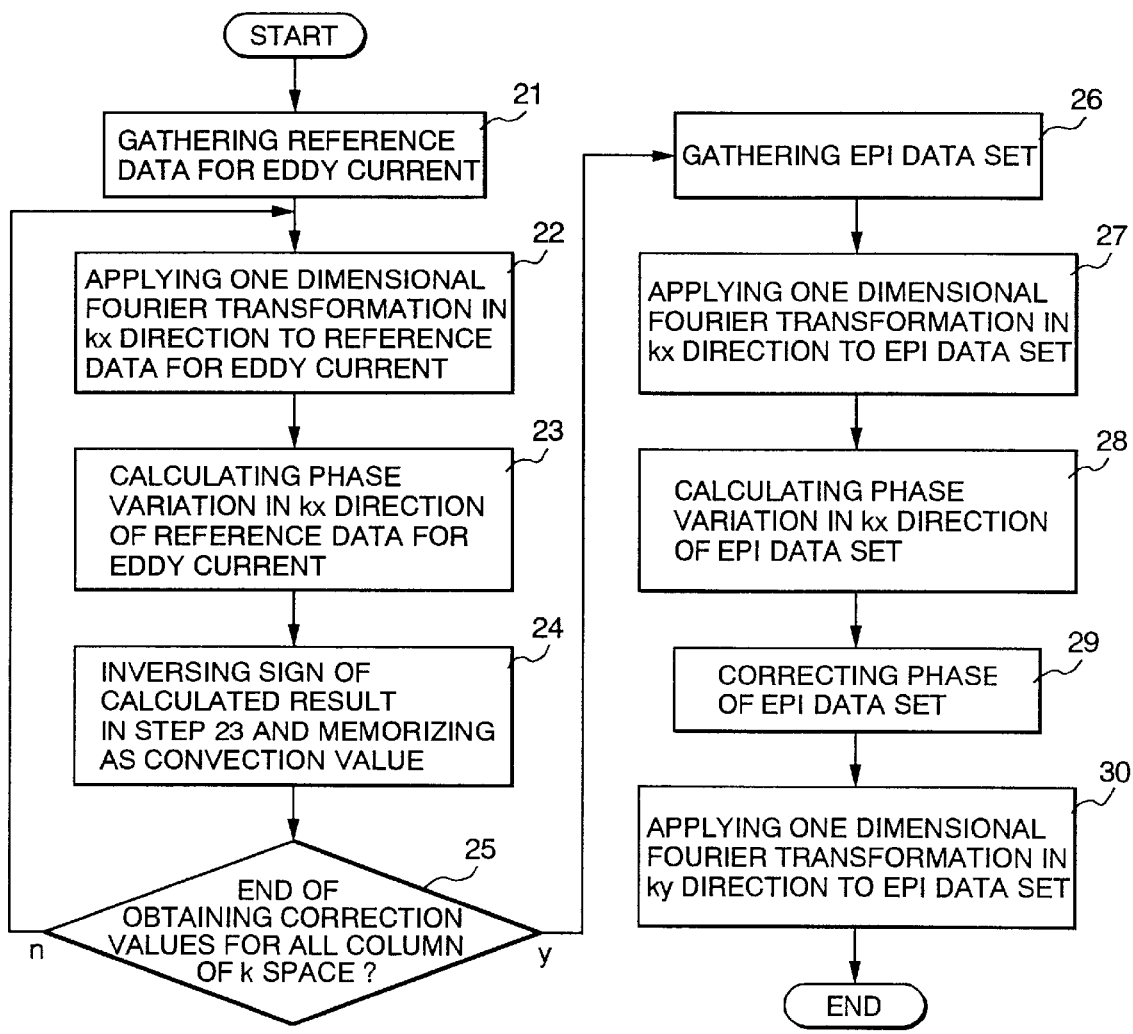
FIG. 5 is a flowchart showing a conventional procedure for acquiring reference data for eddy current to detect disturbance in phase of the echo signal in the EPI and for correcting phase distortion caused by eddy currents.
Figure 6A:
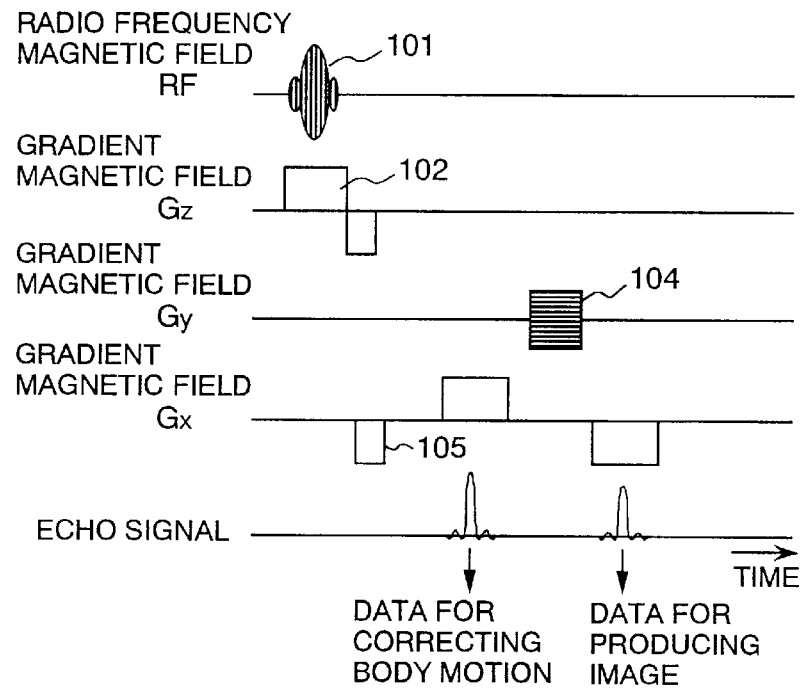
FIG. 6A is a diagram showing an example of a pulse sequence of a conventional technique in which navigator echoes are produced and ordinary image acquisition is performed.
Figure 6B:
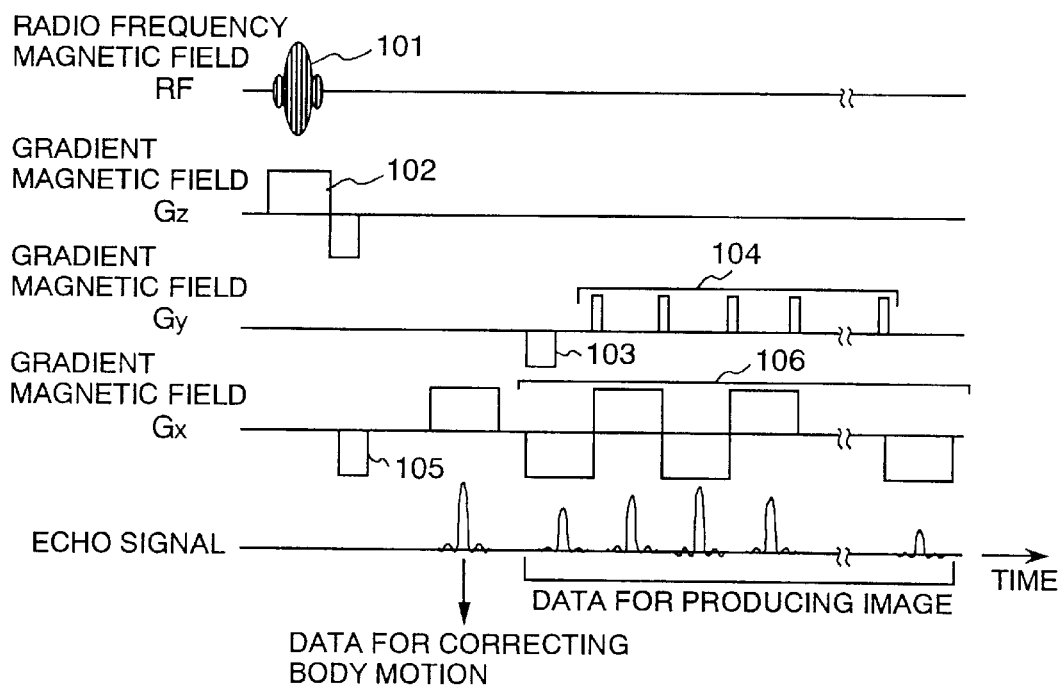
FIG. 6B is a diagram showing an example of the pulse sequence of a conventional EPI for producing the navigator echoes.
Figure 15:
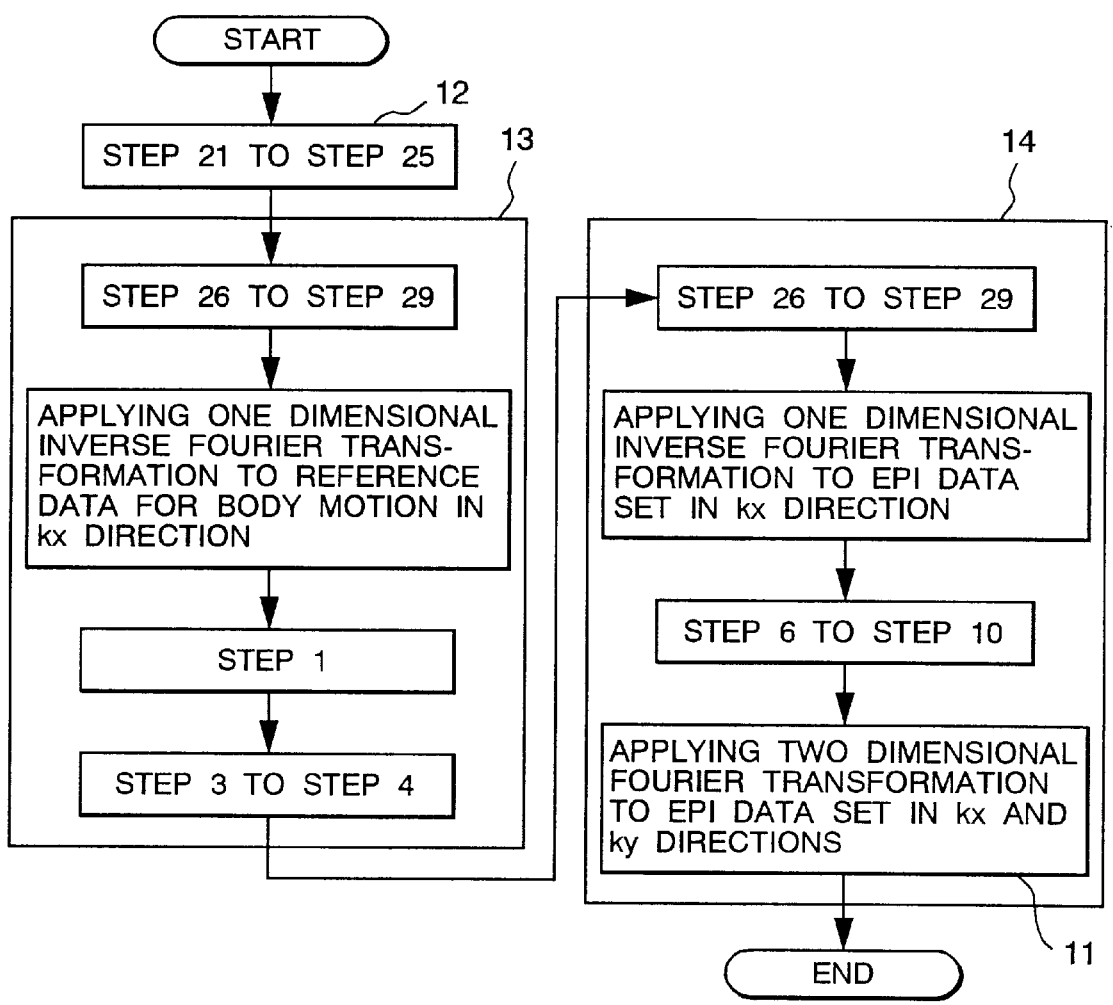
FIG. 15 is a flowchart showing a procedure for reconstructing an image, in which the method of the invention of correcting the body motion and a removal of phase distortion caused by eddy current are combined.

When an EPI image is reconstructed, it is necessary to eliminate a phase distortion caused by eddy currents. A method of reconstructing an image, in which the method of correcting the body motion of the invention and the removal of the phase distortion due to the eddy current are combined, comprises, as shown in a flowchart of FIG. 15: a step (12) of deriving a correction value of the phase distortion caused by the eddy current; a step (13) of calculating a reference phase from the body motion reference data at the time of the image reconstruction; and a step (14) of correcting the body motion after removing the phase distortion caused by the eddy current and calculating the EPI data set at the time of the image reconstruction. That is, after the processes from step 21 to step 25 and from step 26 to step 29 described in FIG. 5, a one-dimensional Fourier transformation in the kx direction is applied to the body motion reference data in which the phase distortion caused by the eddy current is corrected. After that, the processes of steps 1, 3 and 4 described in FIG. 11 are executed. Similarly, with respect to the EPI data set, after removing the phase distortion caused by the eddy current, the body motion is corrected. That is, after the processes from step 26 to step 29 described in FIG. 5, the one-dimensional inverse Fourier transformation in the kx direction is applied to the EPI data set in which the phase distortion caused by the eddy currents is corrected. Subsequently, the processes from step 6 to step 10 described in FIG. 11 are executed. The two-dimensional Fourier transformation (step 11) in both of the kx and ky directions is applied to the EPI data set in which the phase distortion caused by the body motion is corrected, thereby acquiring an image.

The EPI which has been described above is a single-shot EPI for gathering all of the echo signals necessary to reconstruct an image by one excitation. There is also a multishot EPI for acquiring the echo signals a plurality of times. Since there is also a problem of a positional deviation of the brain when the multishot EPI is used for the FMRI, a correction step is necessary. When the method of correcting the body motion of the invention is applied to the multishot EPI, a part of it has to be changed. The change point will be described hereinbelow. After that, a procedure for correcting the body motion in the multishot EPI will be shown.

Figure 16A:
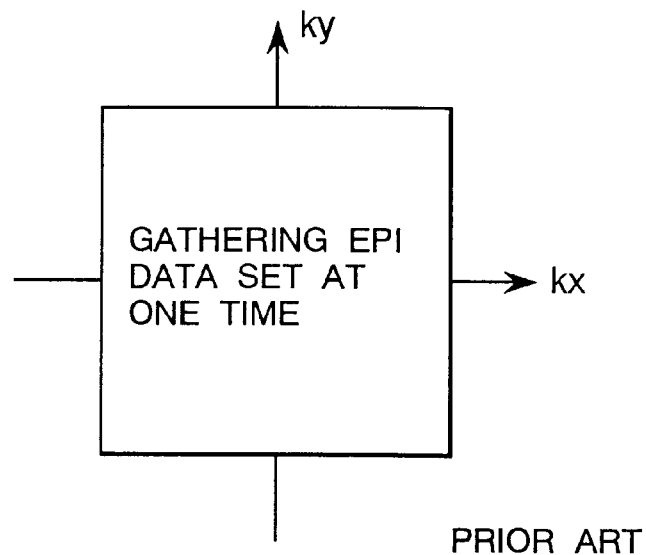
FIG. 16A is a diagram showing an order of gathering a conventional single-shot EPI data set by using the k-space.
Figure 16B:
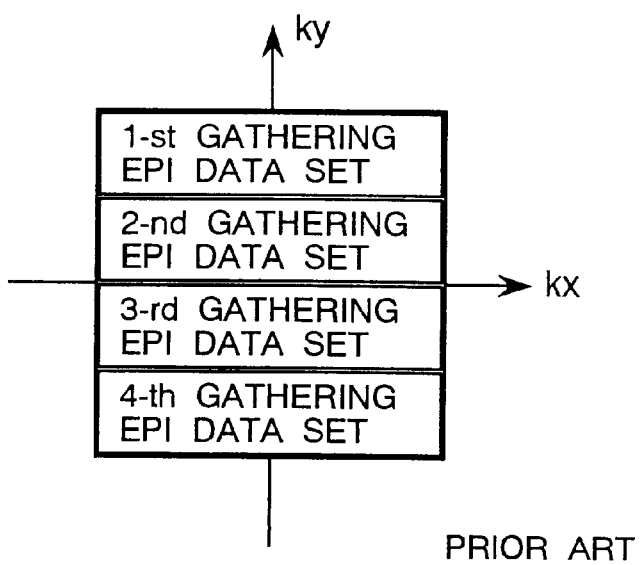
FIG. 16B is a diagram showing an order of gathering a conventional multishot EPI data set by using the k-space.
Figure 17A:
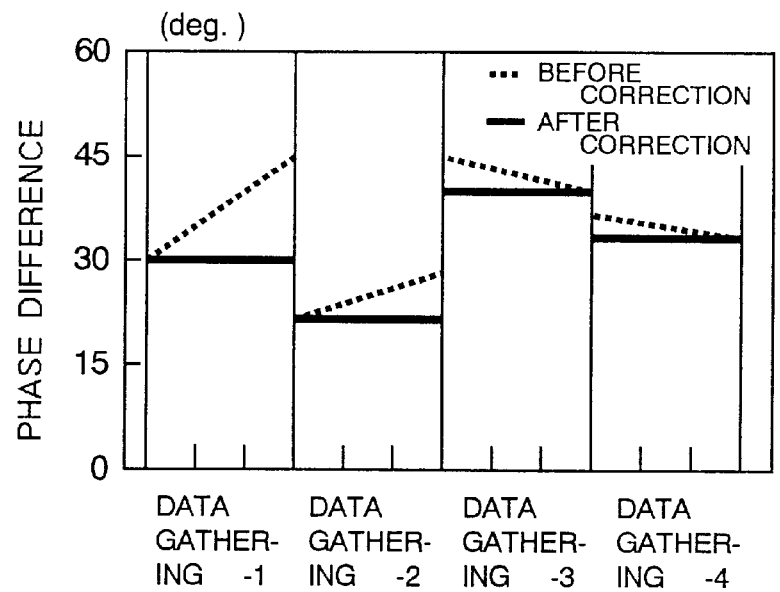
FIG. 17A is a diagram showing an example of a result of application of a method of correcting body motion of a singleshot EPI of the invention to a multishot EPI data set.
Figure 17B:
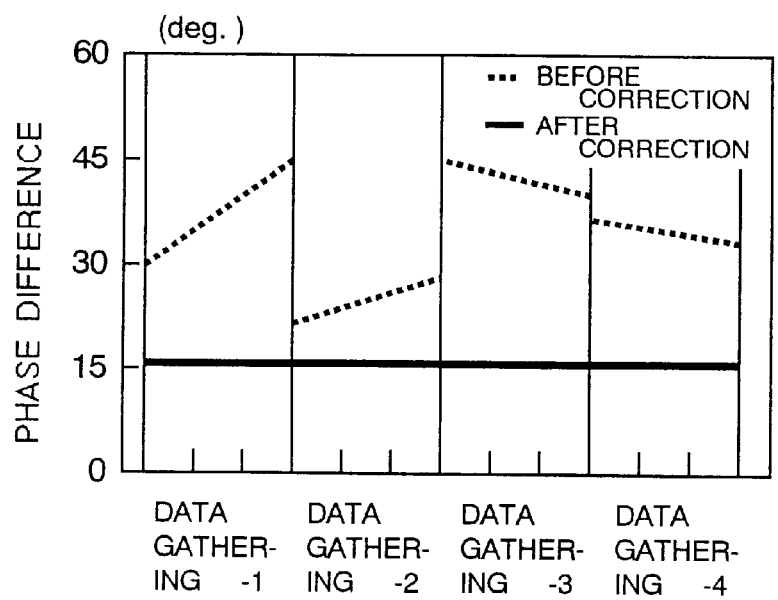
FIG. 17B is a diagram showing an example of a result of application of a body motion correcting method of the singleshot EPI of the invention and a correcting method of removing discontinuity of the phase difference to the multishot EPI data set.
Figure 18:
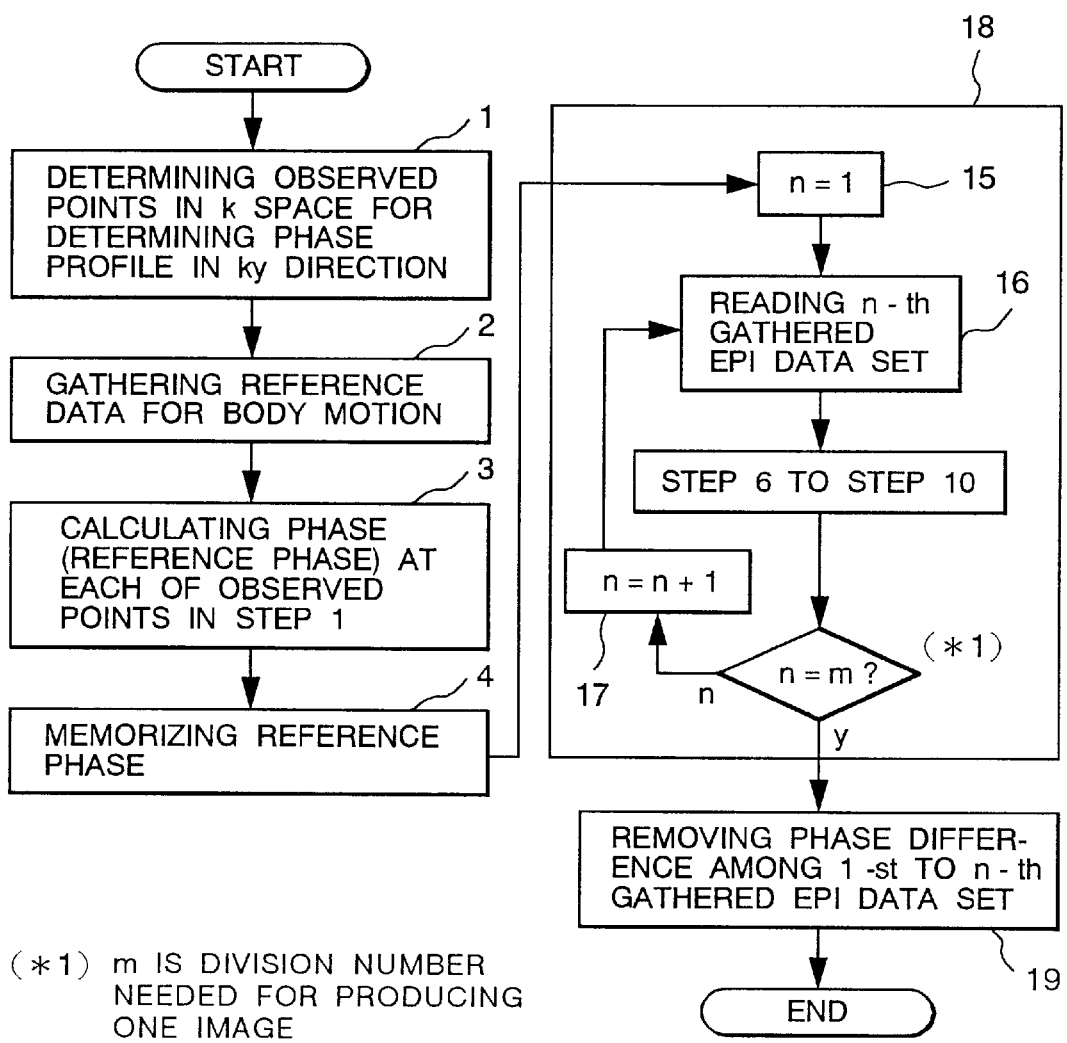
FIG. 18 is a flowchart showing a procedure for correcting the body motion in the multishot EPI data set of the invention.

When there is motion during acquisition of the echo signals, the influence appears as a positional deviation of an image in the singleshot EPI. On the contrary, in the multishot EPI, the influence appears as the positional deviation of the image and unsharpness of the outline. The cause of the difference in the influences will be described. FIG. 16A is a diagram showing the order of acquiring signals of a conventional singleshot EPI by using the k-space. FIG. 16B is a diagram showing the order of acquiring signals of a conventional multishot EPI by using the k-space. It is assumed that one image is formed by the signal acquisition of four times in the multishot EPI. The important points are that when there is an influence by the body motion, among the four-times data acquisition in the multishot EPI, (1) phases are discontinued and (2) inclination of the phase differences by the body motion are different. When the body motion correcting method which is similar to that of the singleshot EPI is used, since there are discontinuous points of the phases as shown in FIG. 17A, the positional deviation of the image and the unsharpness of the outline are not completely solved. Consequently, in the body motion correction in the multishot EPI, a correction algorithm for removing the discontinued points of the phases in addition to the removal of the inclination of the phase differences and forming a phase profile without discontinued points of the phases, after correction as shown in FIG. 17B is necessary. The flowchart of the processing procedure is shown in FIG. 18. It is now assumed that one image is formed by the EPI data sets dividedly gathered by m-times acquisition in the multishot EPI. As shown in FIG. 18, a phase profile in which there are no discontinued points of the phases after correction is formed by: processes from step 1 to step 4 shown in FIG. 11; a step (18) of removing a inclination of the phase difference from the EPI data set acquired by the multishot EPI; and a step (19) of removing the phase difference between the acquired data from the EPI data set gathered by the multishot EPI.

In the EPI data set gathered by the m-times acquisition, the inclination of each phase difference is removed (step 18). That is, a loop counter is initialized to n=1 (step 15), data gathered at the n-th time among the EPI data sets acquired by the multishot EPI is read from the memory (step 16), and processes from step 6 to step 10 shown in FIG. 11 are performed. Subsequently, whether n=m is satisfied or not is judged. When n≠m, the loop counter is updated to (n=n+1) (step 17). When n=m, the phase difference between data gathered from the first to the n-th time is removed (step 19).

Figure 19:
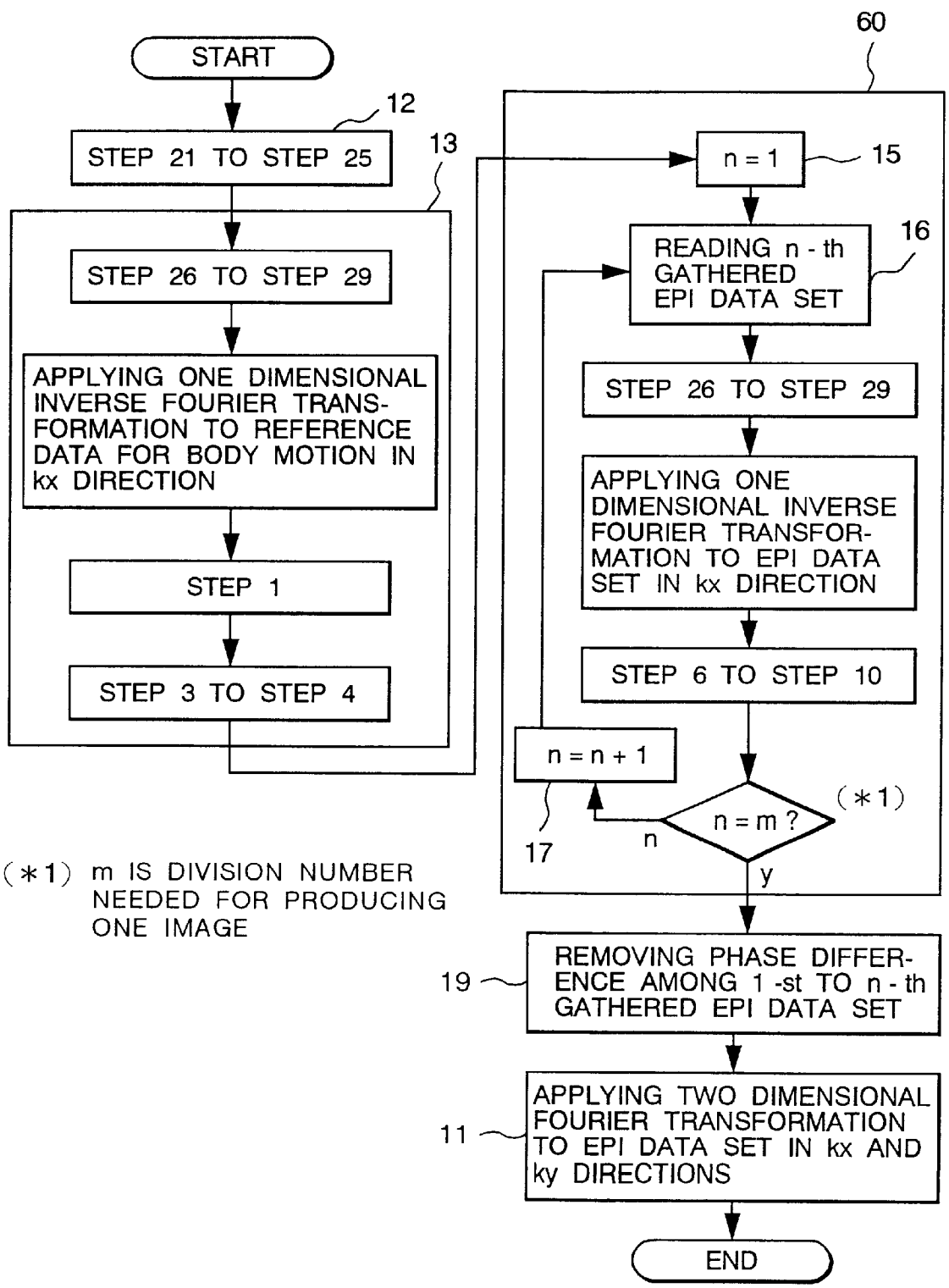
FIG. 19 is a flowchart showing a procedure for reconstructing an image of the multishot EPI data set of the invention, in which the body motion correction and correction of phase distortion caused by the eddy currents are combined.

A flowchart of FIG. 19 shows a method of reconstructing an image in the multishot EPI in which the body motion correcting method of the invention and the removal of the phase distortion caused by the eddy current are combined. It is assumed that one image is formed from the EPI data sets dividedly gathered by m-times acquisition in the multishot EPI. In a manner similar to the method of reconstructing the image in the singleshot EPI, after the phase distortion caused by the eddy current is removed, the body motion is corrected. Consequently, the positional deviation of the image and the unsharpness of the outline which are the problems in the multishot EPI are solved. A process shown in FIG. 19 comprises: steps (12, 13) explained in FIG. 15; a step (60) of removing the inclination of the phase difference by the body motion and the phase distortion caused by the eddy current from the EPI data set acquired by the multishot EPI; a step (19) of removing the phase difference between the acquired data from the EPI data set gathered by the multishot EPI; and a step (11) of applying the two-dimensional Fourier transformation in both of the kx and ky directions to the corrected EPI data set. In the step (60) of removing the phase difference in the EPI data set gathered by the m-times acquisition, the loop counter is initialized to n=1 (step 15), data acquired at the n-th time among the EPI data sets acquired by the multishot EPI is read (step 16), the phase distortion caused by the eddy current is corrected by performing the processes from step 26 to step 29 shown in FIG. 5, the one-dimensional inverse Fourier transformation in the kx direction is applied to the corrected EPI data set, and the processes from step 6 to step 10 described in FIG. 11 are executed. Subsequently, whether (n=m) is satisfied or not is judged. When n≠m, the loop counter is updated to (n=n+1) (step 17). When n=m, the phase difference among data obtained from the first time to the n-th time is removed (step 19).

According to the invention as mentioned above, the correction value which is different every echo signal is derived, so that the body motion can be corrected with high precision. The invention can be also extended to the case where the body motion in the xy plane is corrected.

An embodiment of the invention regarding the second method and apparatus for correcting the positional deviation or distortion of the image by correcting phase errors occurring in image data of the target to be inspected by changes in characteristics of the apparatus caused with the elapse of time during image acquisition in a dynamic scan using the singleshot EPI without using navigator echoes will be described in detail with reference to the drawings.

Figure 1:
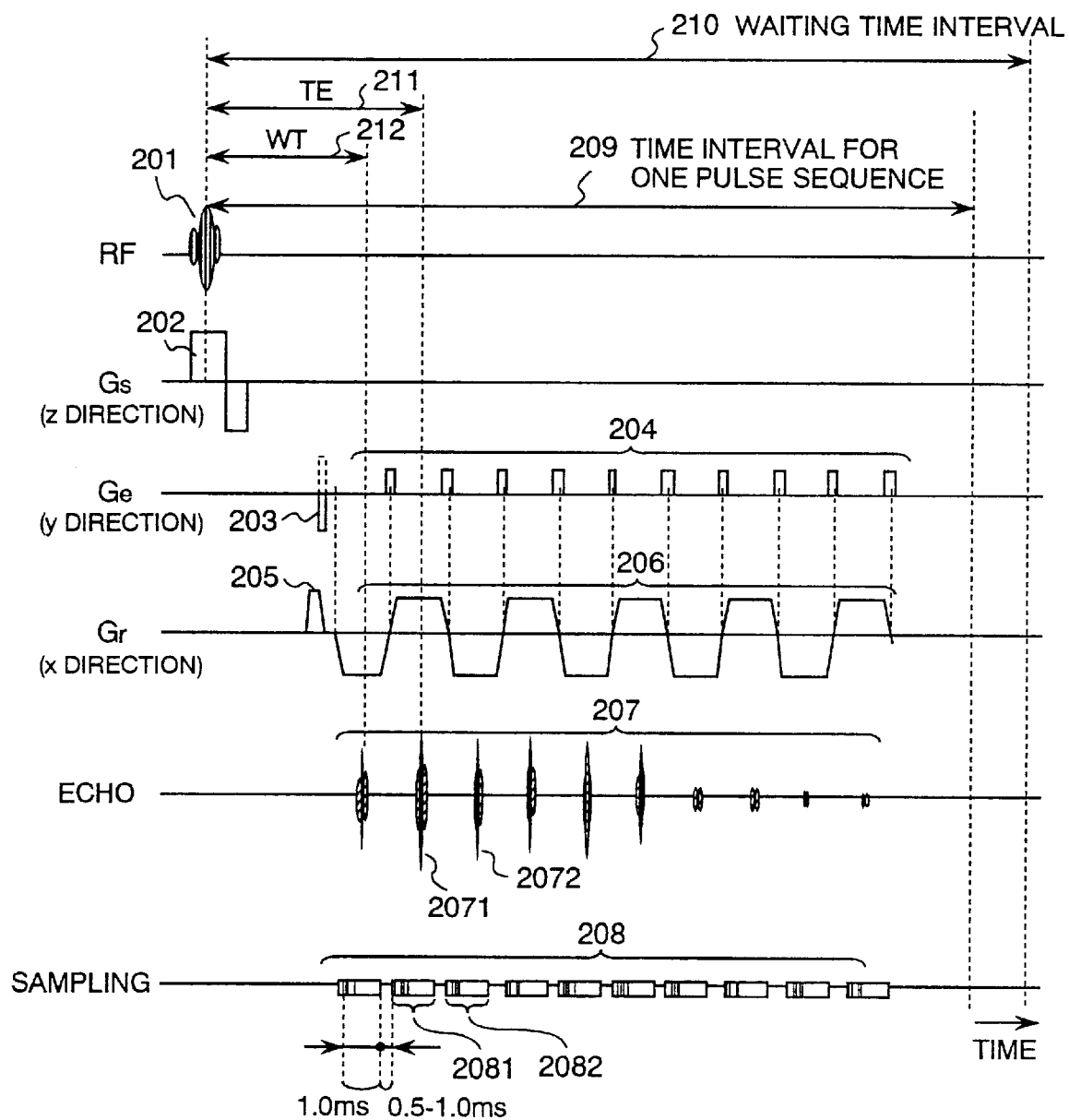
FIG. 1 is a diagram showing an example of a conventional pulse sequence for signal measurement used in the invention.
Figure 2:
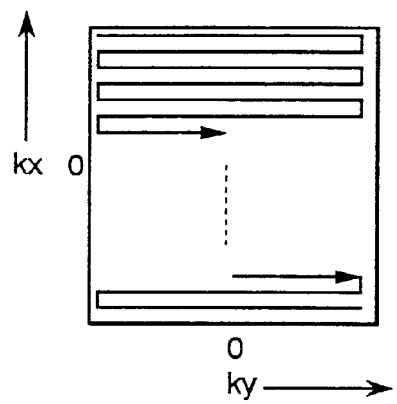
FIG. 2 is a diagram showing trajectory of writing measurement signals to a k-space according to a conventional technique.

The operation of the apparatus when images of the same region of the inspection target are continuously acquired by using the singleshot EPI will be described with reference to FIG. 1. A radio frequency pulse 201 as well as a gradient magnetic field pulse 202 for selecting a slice to be visualized are applied to the object 401 to be inspected, thereby selecting a slice to be visualized of the inspection object 401. That is, only nuclear spins in the slice of the inspection target 401 are selectively excited. Subsequently, a pulse 203 for giving a phase encoding offset and a pulse 205 for giving an offset to the readout gradient magnetic field are applied. The phase encoding offset is applied in order to set a start position of writing the echo signal in the k-space and the offset to the readout gradient magnetic field is applied to dephase the nuclear spin as preparation to generate the echo signal. After that, a readout gradient magnetic field pulse 206 in which the polarity is inverted is continuously applied. The gradient magnetic field pulse 206 has a trapezoid shape. A phase encoding gradient magnetic field 204 is discretely applied synchronously with the polarity changing point of the gradient magnetic field pulse 206. When the phase encoding gradient magnetic field 204 and the readout gradient magnetic field 206 are applied as mentioned above, echo signals 207 are generated. That is, the echo signals 207 to each of which a phase encoding amount is applied in each period of the readout gradient magnetic field 206 in which the polarity is inverted, are generated in a time series manner. The echo signals 207 are sampled in intervals 208 for sampling (sampling intervals 2081, 2082, . . . ), respectively, thereby obtaining time series data. The echo signals gathered as mentioned above are written in the k-space. The data is two-dimensional Fourier transformed and the image is reconstructed. Each of the sampling intervals 2081, 2082, . . . is typically about 1 ms. An interval between the neighboring sampling intervals (an interval in which the sampling is not performed) is about from 0.5 ms to 1 ms. All of echoes necessary for reconstructing the image are acquired in the time interval shown by reference numeral 209 since the RF pulse 201 shown in FIG. 1 is applied. Since the slice to be visualized is determined by the frequency of the RF pulse 201 and the gradient magnetic field 202 in the slicing direction, when the image of the same slice is continuously acquired, the pulse sequence of FIG. 1 is repeated under the same parameters of the frequency of the RF pulse 201 and the gradient magnetic field 202 in the slicing direction and the like. The pulse sequence is repeated after a predetermined waiting time 210 in order to wait for recovery of magnetization. The waiting time is typically one or two seconds. A time interval 209 required to execute one pulse sequence is approximately 100 ms.

There is also proposed a multishot EPI. According to the multishot EPI, echo signals 207 in a part are obtained in the time interval 209 in FIG. 1. While changing the pulse 203 (shown by dotted lines of 203 in FIG. 1) for giving an offset of the phase encoding, the pulse sequence of the time interval 209 is repeated and the remaining echo signals 207 are acquired. According to the multishot EPI, since the pulse sequence of the time interval 209 is repeated, although data acquisition time for acquiring one image is long, the number of the echoes 207 acquired in the time interval 209 is reduced and the time interval 209 itself is shortened. Consequently, deterioration of the echo signals in the latter half of the time interval 209 is reduced and a high quality image can be acquired.

Figure 20:
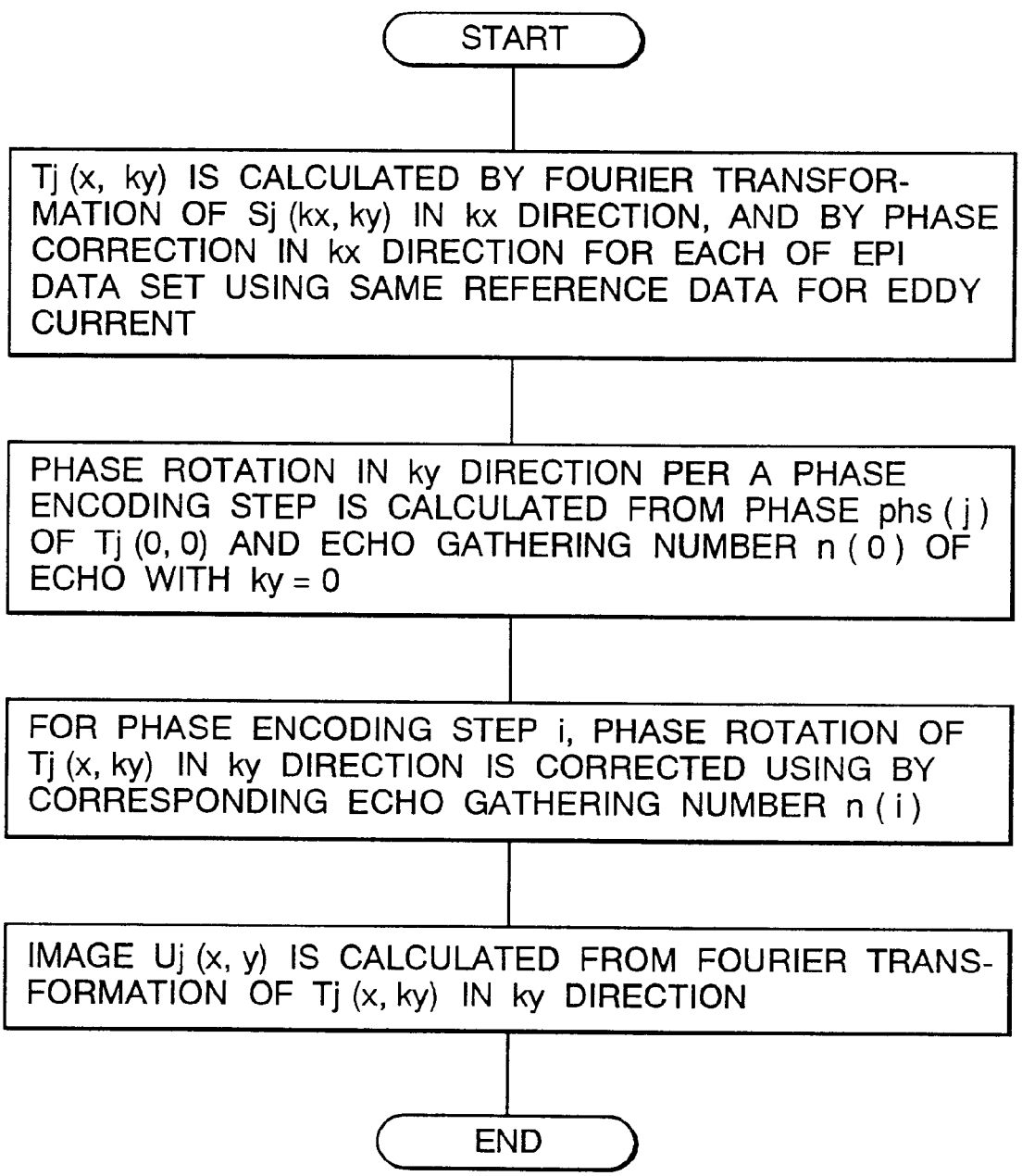
FIG. 20 is a flowchart showing a procedure for correcting signals in the invention.

A signal correcting method according to the invention will be described hereinbelow with reference to FIGS. 20 and 21. The principle of the signal correcting method will be first described. A signal measured when the phase encoding amount is zero on the trajectory in the k-space, that is, a signal of (ky=0) corresponds to data acquired when an image of the inspection target is projected in the ky axis direction. As long as a macroscopic state of the inspection target is not changed, the signal of (ky=0) is supposed to be acquired as the same signal in continuous images. However, when phases of signals of (ky=0) are actually examined with respect to the plurality of continuous images, it is found that there is a phase difference between the images and that the phase difference corresponds to a positional deviation in the ky direction of the reconstructed image. Consequently, as a phase correcting process in the EPI, a method of correcting an EPI data set acquired by main scans-1, -2, . . . by using eddy current reference data obtained by performing a pre-scan is examined as shown in FIG. 22. FIG. 22 shows data acquired by Fourier transforming the eddy current reference data and the EPI data set in the kx direction and by correcting the phase of each EPI image set in the kx direction by using the same eddy current reference data. Although the axis of abscissa of the eddy current reference data is actually time, it is written as ky in order to make clear the correspondence to the EPI data set in FIG. 22. As a result of the examination by the inventors, it is found that when there is fluctuation of the offset of the static magnetic field, phase variations in the ky direction occur as shown by, for example, 1, 2, 3, . . . in the eddy current reference data and the EPI data set. When the variations in the ky direction shown by the data 2, 3, . . . are corrected by the same eddy current reference data (data 1), phase distortion caused by the eddy currents is removed and data 2', 3', . . . is obtained. However, when the data 2' and 3' are compared, the phase change in the ky direction caused by the offset fluctuation of the static magnetic field remains in the data 3'. The primary component of the phase change shifts the Fourier transformed image in the ky direction, thereby causing the positional deviation of the image.

According to the invention, as shown in the lower part of FIG. 22, phase rotation per phase encoding step of the phase change in the ky direction remaining in the EPI data set whose phase was corrected in the kx and ky directions by using the eddy current reference data is obtained and the phase rotation is corrected, thereby correcting the phase errors in the ky direction. That is, data Sj (kx, ky) in the k-space of the j-th image is subjected to the Fourier transformation in the kx direction. By using the same eddy current reference data to each j, data Tj(x, ky) in which the phase is corrected in the kx direction is obtained. A phase rotation phs(j) in the ky direction per phase encoding step is obtained by an approximate linear line acquired from a phase phs0(j) of Tj(0, 0). The phase calculated every encoding from the phase rotation is corrected, thereby correcting the phase in the ky direction. As will be described later, the phase rotation phs(j) in the ky direction per phase encoding step corresponds to a proportion of the product of the phase phs0(j) of Tj(0, 0) and the difference (TE − WT) between TE and WT shown in FIG. 1 for the product of TE and an echo acquisition number n(0) of the echo when the pulse encoding is zero (that is, ky=0). Since phs0(j) can be observed and TE, WT, and n(0) are values peculiar to each pulse sequence, phs(j) is unconditionally determined.

Figure 21:
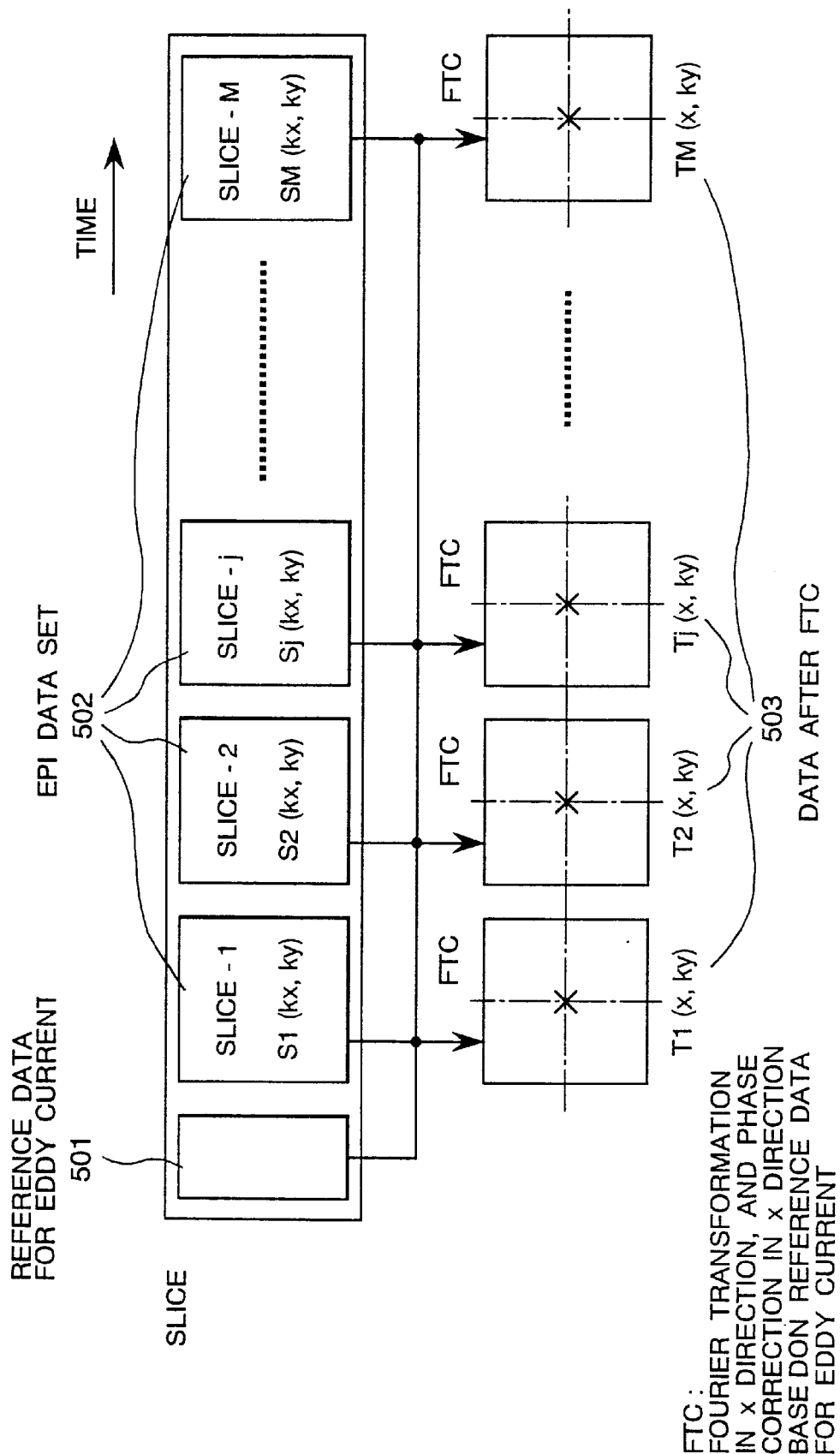
FIG. 21 is a diagram for explaining a signal process using eddy current reference data and the EPI data set of the invention.
Figure 22:
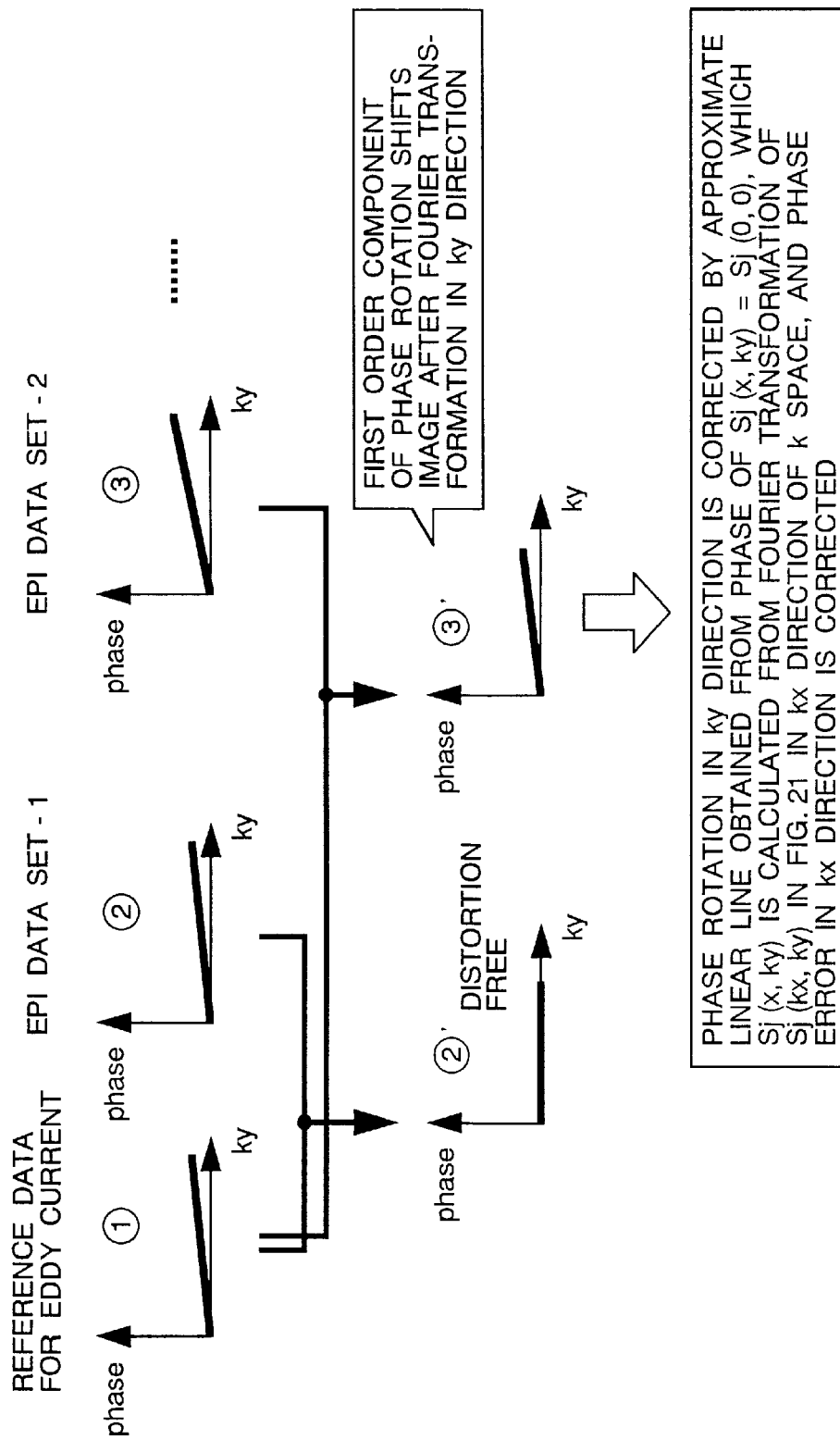
FIG. 22 is a diagram illustrating a conventional phase correcting method in the EPI and a phase correcting method of the invention.

FIG. 21 is a diagram schematically illustrating continuous image acquisition by the EPI. First, reference data 501 for eddy current is acquired. The eddy current reference data is, for example, data of the echo signals obtained without applying the phase encoding in the EPI pulse sequence of FIG. 1. The EPI pulse sequence shown in FIG. 1 is continuously executed M times and continuous EPI data sets 502 of M images (slice-1, -2, . . . , -M) are acquired. In FIG. 21, reference character j denotes an image number and j=1, 2, . . . , M. Sj (kx, ky) denotes data in the k-space of the j-th image and Tj(x, ky) shows data obtained by Fourier transforming Sj(kx, ky) in the kx direction and correcting it by the same eddy current reference data. For example, T1(x, ky) is obtained from the eddy current reference data and S1(kx, ky) and T2 (x, ky)is obtained from the eddy current reference data and S2(kx, ky). That is, the EPI data set 502 is subjected to the Fourier transformation only in the transverse direction (kx direction), thereby acquiring Tj(x, ky) 503. The axis of abscissa of the data 503 shown in FIG. 21 is x and the axis of ordinate is a phase encoding amount ky.

As mentioned above, the phase distortion caused by the eddy currents is corrected by using the reference data for eddy current. In principle, the correction, as a P0 correction (a phase offset of a predetermined value is corrected) and a P1 correction (a phase offset having a linearly changing value is corrected), has effects similar to those of known corrections (Japanese Patent Application Laid-Open No. 5-68674) and all of the phases of Tj(0, 0) is equal to zero. Although the phase is inherently constant at X-marked points in FIG. 21 among the data 503, where (x, ky)=(0, 0) and the same images are supposed to be obtained, the phase is varied in reality. The cause of the phase variation is assumed to be unstableness of a reference frequency f0 and the gradient magnetic field waveform when the echo signal is detected, motion of the inspection target itself which occurs against his/her will, and the like.

The relation between the phase difference of the signal when ky=0 and fluctuation of the inspection target on the image will be described. In the pulse sequence (FIG. 1), time 211 between the center of an echo 2071 when (ky=0) and the center of the RF pulse 201 is called echo time TE. Reference numeral 2072 denotes an echo when (ky=1). It is assumed that time 212 between the center of the RF pulse 201 and the center of the first echo is waiting time WT and the echo number when (ky=0) is n(0). As a result of examination of the inventors, it is found that the phase change caused by peculiar fluctuation in characteristics of the apparatus, which has been described before, is related to the echo time TE, the waiting time WT, and the echo number n(0). With respect to the echo when (ky≠0) as well, it is found that a phase of an amount proportional to the time when the center of each echo since the center of the RF pulse 201 is added in addition to the phase which is inherently applied by only the phase encoding amount. According to the invention, the additional phase rotations are removed.

The procedure of the method of correcting the phase errors will be described hereinbelow. FIG. 20 is a flowchart for describing the signal correcting method of the invention. FIG. 21 is a diagram showing the procedure for acquiring M images of the same region of the inspection target continuously with respect to time by using the pulse sequence of FIG. 1. First, the procedure for reconstructing images will be described with reference to FIG. 21. The acquisition of images is started with a pre-scan. In the pre-scan, data of each echo signal is calculated without applying the phase encoding (Ge=0) in the pulse sequence of FIG. 1 and the reference data for eddy current is acquired. The eddy current reference data is made to correspond to the EPI data set by the main scan of the image acquisition and is used for the correcting operation. The eddy current reference data obtained by the pre-scan is Fourier transformed in the readout direction (kx direction) and Fourier transformed data Tp(x, ky) is stored into a memory. Reference character p denotes the pre-scan.

The main scan for acquiring the first image (j=1) of the target to be inspected is subsequently executed. In the main scan, nuclear spins of the same cross section as the pre-scan are selectively excited by applying the slice direction gradient magnetic field 202 and the RF pulse 201. The phase encoding gradient magnetic fields (Ge) 203, 204 and the readout gradient magnetic fields (Gr) 205, 206 are applied and the echo signal 207 is acquired with respect to time intervals 2080, 2082, ... , of a sampling interval 208 and is arranged in the k-space (EPI data set). When the signal is arranged in the k-space, it is made correspondent to the eddy current reference data. An acquired EPI data set S1(kx, ky) of the first image is Fourier transformed in the readout direction (kx direction) and the phase distortion caused by eddy current is corrected by using eddy current reference data Tp(x, ky), thereby obtaining T1 (x, ky). Subsequently, a phase rotation phs(1) per phase encoding step is calculated from an echo acquisition number n (0) (n=2 in FIG. 1) of the echo 2071 when ky=0, that is, the phase encoding is zero (the echo signal becomes maximum) and a phase phs0(l) of T1 (0, 0). Consequently, a phase rotation phsi(1) of each echo signal in the image number 1 can be expressed by the following expression (8).

$$phsi(1)=phs0(1)+phs(1)\times n(i) \qquad (8)$$

The phase rotation phs(j) per phase encoding step in the image number j can be expressed by the following expression (9).

$$phs(j)=\{phs0(j)\times(TE-WT)\}/\{TE\times n(0)\} \qquad (9)$$

The phase rotations of the acquired echo signals can be calculated by the expressions (8) and (9). In the expressions (8) and (9), reference character i denotes the encoding step and j indicates the image number. Reference character TE is called echo time and is shown by reference numeral 211 in FIG. 1 and WT denotes time from the application of the RF pulse until occurrence of the first echo and is shown by reference numeral 212. The phase shift per step of the encoding is estimated by the expression (9) by judging that phs0(j) is which number of the echo signal and that how many times of the echo time was necessary until the echo signal is generated. The phase correction is performed every phase encoding step to T1 (x, ky), thereby gathering T1' (x, ky). The numerical expression used for the calculation is generalized as shown by the expressions (10).

$$Re\{Tj'(x, ky)\}=Re\{Tj(x, ky)\}\times \cos\{phs(j)\times n(i)\}+Im\{Tj(x, ky)\}\times \sin\{phs(j)\times n(i)\}$$

$$Im\{Tj'(x, ky)\}=Im\{Tj(x, ky)\}\times \cos\{phs(j)\times n(i)\}-Re\{Tj(x, ky)\}\times \sin\{phs(j)\times n(i)\} \qquad (10)$$

In the expression (10), Re{Tj' (x, ky)} denotes a real part of the signal after the phase correction; Im {Tj' (x, ky)} an imaginary part; i an encoding step; n an echo number; and j an image number. In the expression (10), the phase is corrected on the assumption that the phase shift per encoding step calculated in the expression (9) is in proportion to each encoding amount. The signal T1' (x, ky) after the correction is Fourier transformed in the phase encoding direction (ky direction), thereby acquiring an image U1 (x, y). The image U1 (x, y) is a phase-corrected image. The signal correction to the signals gathered by the main scan of the first image has been described above. The signal correction can be also similarly performed with respect to signals acquired by the main scan of the second, third, ... , jth, ... , and Mth images. Although the case where the invention is applied to the 2-dimensional singleshot EPI has been described above, the invention can be also extended to a 3-dimensional imaging and also can be applied to the multishot EPI. Further, the invention can be applied to image acquisition sequences similar to the EPI, such as a spiral scan method and GRSE (gradient and spin echo) method.

In a dynamic scan of the singleshot EPI, 100 images were continuously acquired at TR=2 seconds under the parameters of n(0)=8, TE=18 msec, and WT=10 msec. The target to be inspected was an organism equivalent phantom having a column shape. The image matrix is (128×64) pixels (readout direction phase encoding direction) . A part in which the number of phase encoding was insufficient was extrapolated by a known technique (half Fourier method) (Japanese Patent Application Laid-Open No. 279148). The fluctuation in position in the phase encoding direction of the 100 images was 1.3 pixels (peak to peak). The actually measured value of the phase phs0(j) of the image j having the largest fluctuation in position was 8.2 deg. Consequently, phs(j)=0.82 deg was derived from the expression (9) and the signals were corrected in accordance with the expression (10). Similarly, after all of the image data was processed by the algorithm of the invention, the fluctuation in position in the phase encoding direction of the 100 images was reduced to 0.17 pixel (peak to peak). In a similar experiment using an image of a slice of the head as a target to be inspected, as a result of applying the algorithm of the invention, the fluctuation in position in the phase encoding direction of the 100 images could be reduced to 0.17 pixel (peak to peak).

What is claimed is:

1. An inspection apparatus using nuclear magnetic resonance, comprising:

static magnetic field generating means for generating a static magnetic field;

gradient magnetic field generating means for generating gradient magnetic fields in three directions, respectively;

radio frequency magnetic field generating means for generating a radio frequency magnetic field for exciting nuclear magnetization of a target to be inspected;

detection means for detecting a nuclear magnetic resonance signal from the target to be inspected; and arithmetic and control means for calculating a detection signal of the signal detection means, exciting the nuclear magnetization in a predetermined cross section of the target to be inspected and controlling a pulse sequence for detecting the nuclear magnetic resonance signal, wherein the arithmetic and control means:

(a) controls an echo planar pulse sequence for acquiring a plurality of images of a predetermined same region of the target to be inspected; and (b) (1) arranges echo signal data in a k-space, obtained by measuring the target to be inspected using the echo planar pulse sequence and forms an EPI data set corresponding to each image;

(2) designates a plurality of coordinate points in the k-space as observed points for detecting the body motion, the observed points being arranged in parallel with one of the coordinate axes in the k-space or being arranged in parallel with two or more coordinate axes, respectively, selected from the coordinate axes;

(3) designates a predetermined one of the EPI data sets to reference data for body motion for correcting influence by the body motion of the target to be inspected and calculates reference phase as a phase of the reference data for body motion at each observed point;

(4) calculates the phase of the EPI data set at each observed point;

(5) calculates a body motion correction value expressing the influence by the body motion of the target to be inspected by using the phase difference between the phase of the EPI data set and the reference phase; and (6) executes a process for eliminating the influence by body motion of the target to be inspected by eliminating the phase difference of the EPI data set by using the body motion correction value.

2. The apparatus according to claim 1, wherein in (3), the reference data for body motion is acquired either synchronously with respiration of the target to be inspected, synchronously with electrocardiogram waveform of the target to be inspected, or in a state where the target to be inspected holds his/her breath.

3. The apparatus according to claim 1, wherein (5) includes processes for calculating the phase difference between the phase of the EPI data set and the reference phase at every corresponding observed point and for deriving the correction value for body motion at each observed point from the phase difference at each observed point and the coordinate value in the k-space.

4. The apparatus according to claim 1, wherein (4) includes processes for calculating the phase difference between the phase of the EPI data set and the reference phase at every corresponding observed point and for obtaining at least one approximate linear line by a least-square method from the phase difference at each observed point and the coordinate values in the k-space.

5. The apparatus according to claim 4, wherein in the process for obtaining the approximate linear lines, data points having a high signal intensity among the EPI data set are used as the observed points and the phase difference between data points having a low signal intensity among the EPI data set and the reference phase are obtained from the approximate linear lines and the coordinate values in the k-space.

6. The apparatus according to claim 1, wherein (5) includes processes for calculating the phase difference between the phase of the EPI data set and the reference phase at every corresponding observed point and for obtaining at least one approximate linear line by a least-square method from the phase difference at each observed point and the coordinated values in the k-space, and also a process for deriving a body motion correction value at each coordinate value from the approximate linear lines and the coordinate values in the k-space.

7. The apparatus according to claim 6, wherein in the process for obtaining the approximate linear lines, data points having a high signal intensity among the EPI data set are used as the observed points and the phase difference between data points having a low signal intensity among the EPI data set and the reference phase are obtained from the approximate linear lines and the coordinate values in the k-space.

8. The apparatus according to claim 1, wherein (6) includes a process for removing the phase difference at each coordinate value in the k-space from the EPI data set of the target to be inspected, the phase difference being calculated from the approximate linear lines obtained from the process in (5) for calculating the phase difference between the phase of the EPI data set and the reference phase at every corresponding observed point and forming the approximate linear lines from the phase difference at each observed point and the coordinate values in the k-space.

9. The apparatus according to claim 1, wherein (6) includes a process for removing inclination of the approximate linear lines from the EPI data set of the target to be inspected, the approximate linear lines being obtained from the process in (5) for calculating the phase difference between the phase of the EPI data set and the reference phase at every corresponding observed point and forming the approximate linear lines from the phase difference at each observed point and the coordinate values in the k-space.

10. The apparatus according to claim 1, wherein (6) includes a process for removing offset components and inclinations of the approximate linear lines of the phase difference from the EPI data set of the target to be inspected, the approximate linear lines being obtained from the process in (5) for calculating the phase difference between the phase of the EPI data set and the reference phase at every corresponding observed point and forming the approximate linear lines from the phase difference at each observed point and the coordinate values in the k-space.

11. The apparatus according to claim 1, wherein (5) includes a process for inverting a sign of a phase difference between the phase of the EPI data set and the reference phase and removing it from the EPI data set of the target to be inspected.

12. The apparatus according to claim 1, wherein (6) is implemented after a value for correcting phase distortion caused by eddy currents is derived.

13. An inspecting apparatus using nuclear magnetic resonance, comprising:

static magnetic field generating means for generating a static magnetic field;

gradient magnetic field generating means for generating gradient magnetic fields in three directions, respectively;

radio frequency magnetic field generating means for generating a radio frequency magnetic field for exciting nuclear magnetization of a target to be inspected;

detection means for detecting a nuclear magnetic resonance signal from the target to be inspected; and arithmetic and control means for calculating a detection signal of the signal detection means, exciting the nuclear magnetization in a predetermined cross section of the target to be inspected and controlling a pulse sequence for detecting the nuclear magnetic resonance signal, wherein the arithmetic and control means:

(a) controls an echo planar pulse sequence for acquiring a plurality of images of a predetermined same region of the target to be inspected; and (b) (1) calculates a value for correcting phase distortion occurring when an EPI pulse sequence is implemented from an echo signal obtained by measuring the target to be inspected at least in a part of the EPI pulse sequence;

(2) arranges the echo signals obtained by measuring the target to be inspected using the EPI pulse sequence in a k-space, thereby forming an EPI data set corresponding to each image;

(3) designates a plurality of data points in the k-space as observed points for detecting the body motion, the observed points being arranged in parallel to one of the coordinate axes in the k-space or being arranged in parallel to two or more coordinate axes, respectively, selected from the coordinate axes;

(4) designates a predetermined one of the EPI data sets to reference data for body motion for correcting influence by the body motion of the target to be inspected and calculates a reference phase as a phase of the reference data for body motion at each observed point;

(5) calculates a phase of the EPI data set at each observed point;

(6) calculates a body motion correction value expressing the influence by the body motion of the target to be inspected by using the phase difference between the phase of the EPI data set and the reference phase;

(7) removes the influence by the body motion of the target to be inspected by removing the phase difference of the EPI data set by using the body motion correction value; and (8) executes a process for reconstructing an image by using the EPI data set in which the influence by the body motion of the target to be inspected is removed.

14. The apparatus according to claim 13, wherein in (4), the reference data for body motion is acquired either synchronously with respiration of the target to be inspected, synchronously with electrocardiogram of the target to be inspected, or in a state where the target to be inspected holds his/her breath.

15. The apparatus according to claim 13, wherein (6) includes processes for calculating the phase difference between the phase of the EPI data set and the reference phase at every corresponding observed point and for deriving the body motion correction value at each observed point from the phase difference at every coordinate point and the coordinate values in the k-space.

16. The apparatus according to claim 13, wherein (6) includes processes for calculating the phase difference between the phase of the EPI data set and the reference phase at every corresponding observed point and for obtaining at least one approximate linear line by a least-square method from the phase difference at each observed point and the coordinate values in the k-space.

17. The apparatus according to claim 16, wherein in the process for obtaining the approximate linear lines, data points having a high signal intensity among the EPI data set are used as the observed points and the phase difference between data points having a low signal intensity among the EPI data set and the reference phase are obtained from the approximate linear lines and the coordinate values in the k-space.

18. The apparatus according to claim 13, wherein (6) includes processes for calculating the phase difference between the phase of the EPI data set and the reference phase at every corresponding observed point and for obtaining at least one approximate linear line by a least-square method from the phase differences at each observed point and the coordinate values in the k-space, and also includes a process for deriving a body motion correction value at each coordinate value from the approximate linear lines and the coordinate values in the k-space.

19. The apparatus according to claim 18, wherein in the process for obtaining the approximate linear lines, data points having a high signal intensity among the EPI data set are used as the observed points and the phase difference between data points having a low signal intensity among the EPI data set and the reference phase are obtained from the approximate linear lines and the coordinate values in the k-space.

20. The apparatus according to claim 13, wherein (7) includes a process for removing the phase difference at each coordinate value in the k-space from the EPI data set of the target to be inspected, the phase difference being calculated from the approximate linear lines obtained from the process in (6) for calculating the phase difference between the phase of the EPI data set and the reference phase at every corresponding observed point and forming the approximate linear lines from the phase difference at each observed point and the coordinate values in the k-space.

21. The apparatus according to claim 13, wherein (7) includes a process for removing an inclination of the approximate linear lines from the EPI data set of the target to be inspected, the inclination obtained from the process in (6) for calculating the phase difference between the phase of the EPI data set and the reference phase at every corresponding observed point and the coordinate values in the k-space.

22. The apparatus according to claim 13, wherein (7) includes a process for removing offset components of an inclination of the approximate linear lines of the phase difference from the EPI data set of the target to be inspected, the approximate linear lines being obtained from the process in (6) for calculating the phase difference between the phase of the EPI data set and the reference phase at every corresponding observed point and forming the approximate linear lines from the phase difference at each observed point and the coordinate values in the k-space.

23. The apparatus according to claim 13, wherein (6) includes a process for inverting a sign of a phase difference between the phase of the EPI data set and the reference phase and removing it from the EPI data set of the target to be inspected.

24. The apparatus according to claim 13, wherein (7) is implemented after a value for correcting phase distortion caused by eddy currents is derived.

25. An inspection apparatus using nuclear magnetic resonance, comprising:

static magnetic field generating means for generating a static magnetic field;

gradient magnetic field generating means for generating gradient magnetic fields in three directions, respectively;

radio frequency magnetic field generating means for generating a radio frequency magnetic field for exciting nuclear magnetization of a target to be inspected;

detection means for detecting a nuclear magnetic resonance signal from the target to be inspected; and arithmetic and control means for calculating a detection signal of the signal detection means, exciting the nuclear magnetization in a predetermined cross section of the target to be inspected and controlling a pulse sequence for detecting the nuclear magnetic resonance signal, wherein the arithmetic and control means:
  (a) controls a predetermined pulse sequence for acquiring a plurality of images of a predetermined same region of the target to be inspected a plurality of times by an echo planar imaging; and
  (b) (1) arranges echo signal data in a k-space, obtained by measuring the target to be inspected using the echo planar pulse sequence and forms an EPI data set corresponding to each image;
  (2) estimates a phase rotation amount of the a zero-encode echo signal in which a phase encoding amount by a phase encoding gradient magnetic field pulse is zero in the EPI data set and a time difference between the center of the zero-encode echo signal and the center of a radio frequency pulse, and detects fluctuation in the phase rotation amount between the images from the estimated phase rotation amount;
  (3) determines a phase correction amount for each echo signal in the EPI data set; and
  (4) corrects the phase of each echo signal in the EPI data set.

* * * * *